(12) United States Patent
Lakkis

(10) Patent No.: US 7,934,147 B2
(45) Date of Patent: Apr. 26, 2011

(54) TURBO LDPC DECODING

(75) Inventor: Ismail Lakkis, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 20 days.

(21) Appl. No.: 12/501,018

(22) Filed: Jul. 10, 2009

(65) Prior Publication Data

US 2009/0276682 A1    Nov. 5, 2009

Related U.S. Application Data

(63) Continuation-in-part of application No. 11/462,241, filed on Aug. 3, 2006, now Pat. No. 7,853,862.

(60) Provisional application No. 60/705,277, filed on Aug. 3, 2005.

(51) Int. Cl.
*G06F 11/00* (2006.01)
(52) U.S. Cl. .................................................... 714/800
(58) Field of Classification Search .......... 714/800–801, 714/804, 864
See application file for complete search history.

(56) References Cited

U.S. PATENT DOCUMENTS

| | | | |
|---|---|---|---|
| 3,703,705 A | 11/1972 | Patel | |
| 3,745,526 A | 7/1973 | Hong et al. | |
| 5,425,038 A | 6/1995 | Chen | |
| 6,715,121 B1 | 3/2004 | Laurent | |
| 7,178,080 B2 | 2/2007 | Hocevar | |
| 7,246,304 B2 | 7/2007 | Kim | |
| 7,395,490 B2 | 7/2008 | Richardson et al. | |
| 7,502,987 B2 * | 3/2009 | Kyung et al. | 714/781 |
| 7,653,867 B2 * | 1/2010 | Stankovic et al. | 714/785 |
| 2007/0043998 A1 | 2/2007 | Lakkis | |
| 2008/0263425 A1 | 10/2008 | Lakkis | |

FOREIGN PATENT DOCUMENTS

WO    2007019187    2/2007

OTHER PUBLICATIONS

International Preliminary Report on Patentability- PCT/US2006/030145, The International Bureau of WIPO- Geneva, Switzerland.
Written Opinion- PCT/US2006/030145, International Search Authority- US, Jul. 12, 2007.
International Search Report- PCT/US2006/030145, International Search Authority- US, Jul. 12, 2007.
M. Mansour et al., "High-Throughput LDPC Decoders," IEEE Transactions on Very Large Scale Integrations systems, vol. 11, No. 6, Dec. 2003.

(Continued)

*Primary Examiner* — Shelly A Chase
(74) *Attorney, Agent, or Firm* — Dang M. Vo

(57) ABSTRACT

An iterative low-density parity-check (LDPC) decoding system comprises a first shift register for storing bit estimates, a plurality of parity-check processing node banks configured for processing the bit estimates for generating messages, combiners configured for combining the messages with the bit estimates for generating updated bit estimates, and fixed permuters for permuting the updated bit estimates to facilitate storage and access of the bit estimates. A second shift register is provided for storing the messages, and a subtraction module subtracts messages generated a predetermined number of cycles earlier from the updated bit estimates.

58 Claims, 20 Drawing Sheets

OTHER PUBLICATIONS

Guilloud, "Architecture generique de decodeur de codes LDPC," Jul. 2, 2004, These Presentee Pour Obtenir Le Grade de Docteur de L'Ecolenational Superieure Des Telecommunications. XP002370625.

Richardson, et al., "Efficient Encoding of Low-Density Parity-Check Codes," Feb. 1, 2001, IEEE Transactions on Information Theory, US, XP011027880.

Sha, et al., "Efficient Decoder Implementation for QC-LDPC Codes," Jun. 1, 2006, Communications, Circuits and Systems Proceedings, 2006 International Conference on, IEEE, PI, pp. 2498-2502, XP031010935.

Yadav, et al., "Design and Implementation of LDPC Codes for DVB-S2,", 2005, Conf. record of the 39th Asilomar Conf. on Signals, Systems and Computers, Oct. 28-Nov. 1, 2005, USA, pp. 723-728, XP010900097.

International Search Report—PCT/US09/046175. International Searching Authority—European Patent Office, Oct. 8, 2009.

Written Opinion—PCT/US09/046175, International Searching Authority—European Patent Office, Oct. 8, 2009.

Min-Seok Oh et al., Scalable LDPC coding for OFDMA, Aug. 13, 2004, IEEE 802.16 Broadband wireless access working group, <http://ieee 802.org/16> retreived from google.com on Mar. 9, 2010 pp. 1-10.

* cited by examiner

TURBO LDPC DECODING

CROSS-REFERENCE TO RELATED APPLICATIONS

This application is a Continuation-in-Part of U.S. Pat. Appl. Ser. No. 11/462,241, filed Aug. 3, 2006, now U.S. Pat. No. 7,853,862, claims priority under 35 U.S.C. 119(e) to U.S. Provisional Application Ser. No. 60/705,277, filed Aug. 3, 2005, both of which are incorporated herein by reference.

BACKGROUND OF THE INVENTION

I. Field of the Invention

The embodiments described herein are related to Low-Density Parity-Check coding and decoding.

II. Description of the Related Art

Low-density parity-check (LDPC) codes are linear block codes that employ a sparse (i.e., low-density) parity-check matrix. The parity check matrix comprises element values of 1 and 0, and is considered sparse if there are few 1's in each row and column. For example, in a sparse n×m parity check matrix, $w_c \ll n$ and $w_r \ll m$, where $w_c$ is the number of 1's in each column and $w_r$ is the number of 1's in each row.

Tanner graphs, which are bipartite graphs, are commonly used to represent LDPC codes. A Tanner graph comprises n variable nodes and m check nodes, and connections (i.e., edges) between the variable and check nodes correspond to 1-values in the n×m parity check matrix. For example, matrix element $h_{ij}=1$ indicates that the $j^{th}$ check node is connected to the $i^{th}$ variable node.

Decoding algorithms configured for LDPC codes typically employ iterative procedures, such as the message-passing algorithm. An initial step comprises tentatively setting the variable data bits to the received data-bit values and sending those values to the check nodes. This is followed by a second step in which each check node calculates response messages using the variable data bit values received from multiple variable nodes. to be sent back to each variable node.

During the second step, an $i^{th}$ check node calculates a response message for a $j^{th}$ variable node by employing only the received data-bit values from the other variable nodes to which it is connected and using those values in a parity-check equation to determine what the $j^{th}$ variable node's data-bit value should be. The $i^{th}$ check node similarly calculates specific response messages for its other associated variable nodes. The $i^{th}$ check node transmits a response message to each of its associated variable nodes.

At the beginning of a third step, the $j^{th}$ variable node receives the response message from the $i^{th}$ check node and at least one additional check-node response message from another check node. It then uses these response messages (i.e., suggestions) and its original received data-bit value in a decision process to update its estimated data-bit value. A subsequent iteration begins when the variable nodes send their updated data-bit values to their respective check nodes.

Decoding is typically a highly computationally complex process. Techniques for reducing computational complexity result in other significant obstacles, including increased memory requirements and interconnection complexity.

SUMMARY OF THE INVENTION

Embodiments disclosed herein may be advantageous to systems employing single-carrier and OFDM signals used in 60 GHz millimeter wave systems, such as defined by the IEEE802.15.3c protocol. However, the invention is not intended to be limited to such systems, as other applications may benefit from similar advantages.

An iterative low-density parity-check (LDPC) decoding system comprises a first shift-register means configured for storing bit estimates, a parity-check processing means configured for processing the bit estimates for generating messages, a combining means configured for combining the messages with the bit estimates for generating updated bit estimates, and a fixed permutation means configured for permuting the updated bit estimates to facilitate bit-estimate storage and access. A second shift-register means stores the messages, and a subtraction means subtracts messages generated a predetermined number of cycles earlier from the updated bit estimates.

The first shift-register means may include, by way of example, but without limitation, a computer hardware element constructed to perform shifting of stored data bits, such as a shift register comprising a plurality of shift stages.

The parity-check processing means may include, by way of example, but without limitation, one or more banks of parity-check node processors (PCNPs), each bank comprising a plurality of PCNPs. The parity-check processing means may be configured for decoding a super code corresponding to a parity-check sub-matrix. The parity-check processing means may further comprise a converter means configured for operating on a plurality of PCNP outputs to generate a single s bit and a single set of first and second minima. Such a converter means is useful to support multi-rate LDPC decoding.

The fixed permutation means may include, by way of example, but without limitation, a permuter comprising a plurality of inputs, a plurality of outputs, a plurality of shifted base-matrix operators, and coupled to one of the plurality of outputs, and a plurality of fixed connectors coupling the plurality of inputs to the plurality of shifted base-matrix operators.

The second shift-register means may include similar structures as those employed in the first shift-register means.

In some embodiments of the invention, the parity-check processing means may be configured for generating a compressed output signal. For example, the parity-check processing means may be configured for performing an XOR operation on a plurality of input sign bits for generating an s bit, calculating first and second minima from a plurality of reliability values corresponding to each input signal, and generating a plurality of indicator bits, each of the plurality of indicator bits indicating whether a corresponding one of the plurality of reliability values is the first or second minima.

In another embodiment of the invention, a method for calculating a parity-check vector for a given parity-check matrix comprises partitioning the parity-check matrix into a first matrix and a second matrix. The first matrix is configured for operating on a data vector and the second matrix is configured for operating on the parity-check vector. The second matrix employs a triangular arrangement of square matrices to simplify processing. An intermediate vector that results from the first matrix operating on the data vector is calculated, which allows calculation of the parity-check vector. The triangular arrangement of the second matrix is used to generate a sequence of equations, which are easily solved.

Although particular embodiments are described herein, many variations and permutations of these embodiments fall within the scope and spirit of the invention. Although some benefits and advantages of the preferred embodiments are mentioned, the scope of the invention is not intended to be limited to particular benefits, uses, or objectives. Rather, embodiments of the invention are intended to be broadly applicable to different wireless technologies, system configurations, networks, and transmission protocols, some of which are illustrated by way of example in the figures and in the following description of the preferred embodiments. The detailed description and drawings are merely illustrative of the invention rather than limiting, the scope of the invention being defined by the appended claims and equivalents thereof.

BRIEF DESCRIPTION OF THE DRAWINGS

Embodiments according to the present invention are understood with reference to the following figures.

DESCRIPTION OF PREFERRED EMBODIMENTS

Figure 1A:
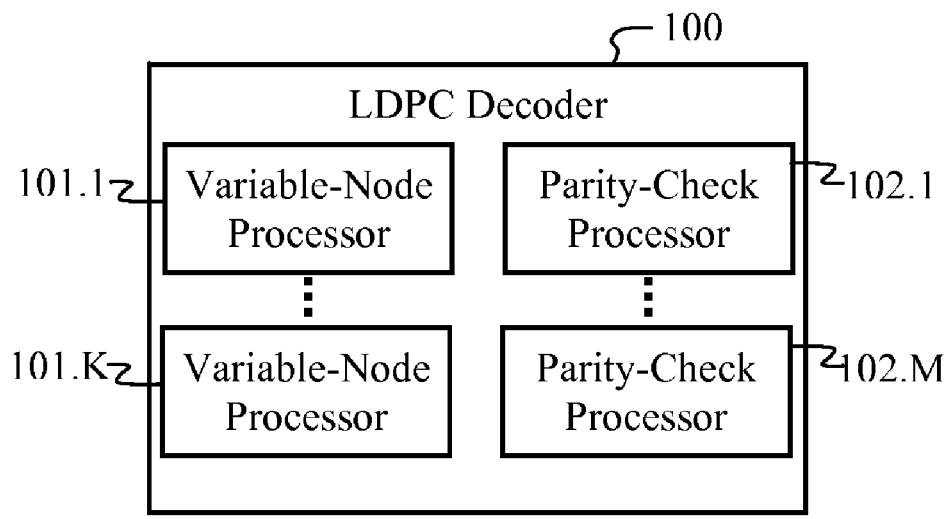
FIG. 1A is a block diagram of an LDPC decoder in accordance with an embodiment of the invention.

While the invention is susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives falling within the spirit and scope of the invention as defined by the claims.

In accordance with one embodiment of the invention, an LDPC encoder employs a generator matrix $G_{N \times K}$ that operates on a data vector $d_{K \times 1}$ to produce a codeword $c_{N \times 1}$ having a total number of bits N comprising K data bits and $M=N-K$ parity-check bits.

$$c_{N \times 1} = G_{N \times K} d_{K \times 1}$$

For a given message vector $d_{K \times 1}$, the encoder generates a parity-check vector $P_{M \times 1}$ and produces the codeword $c_{N \times 1}$.

$$c_{N \times 1} = \begin{bmatrix} d_{K \times 1} \\ p_{M \times 1} \end{bmatrix} \text{ such that } Hc = 0,$$

where H denotes a parity-check matrix. An LDPC decoder employs a parity-check matrix $H_{K \times N}$ defined by $H_{K \times N} c_{N \times 1} = 0$. Each row of the parity-check matrix $H_{K \times N}$ corresponds to a particular parity-check node of a Tanner graph.

FIG. 1A is a block diagram of an LDPC decoder 100 in accordance with an embodiment of the invention. The LDPC decoder 100 comprises a plurality K of variable-node processors 101.1-101.K and a plurality M of parity check processors 102.1-102.M. In one embodiment of the invention, parity checks at a particular parity-check node may be performed by one of the parity-check processors 102.1-102.M. Thus, each parity-check node may have its own parity-check processor 102.1-102.M. Similarly, operations at each variable node may be performed by a dedicated variable-node processor 101.1-101.K. Thus, each variable node may have its own variable-node processor 101.1-101.K.

Different embodiments may employ different processing configurations that include various combinations of hardware and software. For example, a single hardware component may be configured to perform parity-check processing for all of the parity-check nodes. Such a hardware component may comprise a plurality of programmable software modules or computer programs residing on a computer-readable medium, each configured for performing parity-check processing for a particular parity-check node.

A software module, as used herein, refers to a part of a computer program. In this case, a particular software module and/or computer program in combination with the digital computing system on which it resides is referred to as a parity-check processor. Similarly, a single hardware component having a plurality of software modules and/or computer programs may be configured for performing processing at a plurality of variable nodes. Thus, a particular software module and/or computer program in combination with the digital computing system on which it resides can be referred to as a variable-node processor.

Figure 1B:
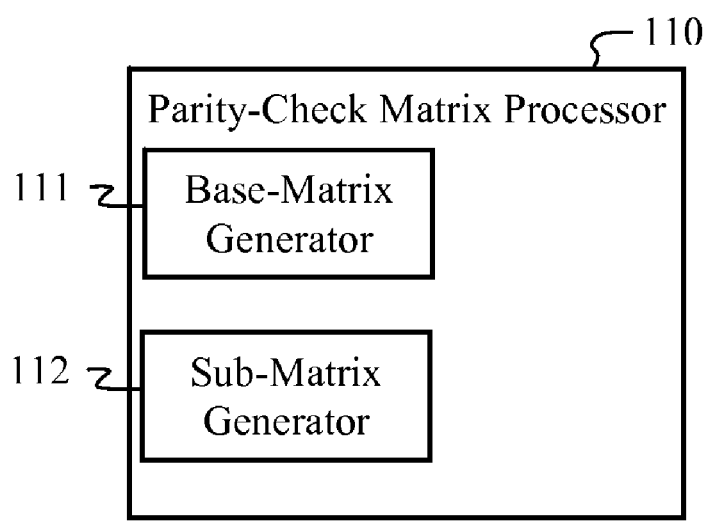
FIG. 1B illustrates components of a parity-check matrix processor.

In accordance with one embodiment of the invention, a parity-check processor 102.1-102.M comprises a parity-check matrix processor 110, such as shown in FIG. 1B. The parity-check matrix processor 110 is configured to construct a K×N parity-check matrix $H_{K \times N}$ as a $K_{base} \times N_{base}$ matrix whose elements are sub-matrices, wherein each sub-matrix is an $N_{perm} \times N_{perm}$ square matrix. Thus, $$N = N_{base} \cdot N_{perm}, \text{ and}$$

$$K = K_{base} \cdot N_{perm}$$

Each $N_{perm} \times N_{perm}$ square matrix is either a zero matrix or a cyclically shifted $N_{perm} \times N_{perm}$ identity matrix constructed by a base-matrix generator 111.

In one embodiment of the invention, the $K_{base} \times N_{base}$ matrix comprises a matrix arrangement of square sub-matrices. Each square sub-matrix is produced by a sub-matrix generator 112 using one or more cyclic-shifted base matrices produced by the base-matrix generator 111. For example, each square sub-matrix element may be an $N_{perm} \times N_{perm}$ zero matrix or a cyclically shifted $N_{perm} \times N_{perm}$ identity matrix. In alternative embodiments of the invention, a cyclically shifted $N_{perm} \times N_{perm}$ D-matrix or Q-matrix may be used instead of the cyclically shifted identity matrix. Each sub-matrix row and each sub-matrix column comprises only one non-zero $N_{perm} \times N_{perm}$ matrix. Thus, parity-check equations corresponding to different rows of a sub-matrix are orthogonal.

Figure 2:
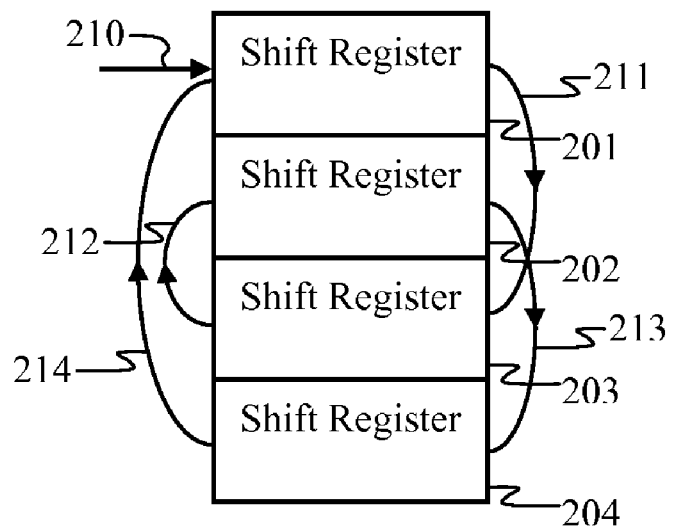
FIG. 2 is a block diagram of a shift register configured to operate in accordance with embodiments of the invention.

The sub-matrices may be constructed using a companion matrix and a shift register by employing at least one of a set of patterns and at least one of a set of entrance points, such as described in U.S. patent application Ser. No. 11/462,241, filed on Aug. 3, 2006, which is incorporated by reference herein. FIG. 2 is a block diagram of a shift register having four stages 201-204, an entrance point 210, and a pattern of transitions 211-214 linking the stages 201-204. In some embodiments, the shift register may be adapted to change the entrance point 210 and/or the pattern of transitions 211-214. The sub-matrix generator may comprise such a shift register or any combination of hardware and software configured to simulate the operation of a shift register adapted with respect to embodiments of the invention.

Matrix-element values in the companion matrix correspond to the number of cyclic shifts applied to each $N_{perm} \times N_{perm}$ identity matrix employed in the parity-check matrix. In one embodiment of the invention, an $N_b \times N_b$ square sub-matrix of the parity-check matrix is constructed by providing a length-$N_b$ vector to an $N_b$-stage shift register having a predetermined shift pattern and a predetermined entrance point. Each vector element's value corresponds to a number of cyclic shifts of the identity matrix. Once the shift register is fully populated by the vector, each vector element's value is assigned to a particular column in an $N_b \times N_b$ square companion sub-matrix. That value is always assigned to the same column, but the row it occupies within that column depends on which shift-register stage (and thus, the pattern) the value is in.

Each value is placed in a unique row and column of the companion sub-matrix. Thus, the corresponding parity-check sub-matrix has a single non-zero value (e.g., a cyclically shifted identity matrix) for each column and for each row. In some embodiments of the invention, one or more cycles following full population of the shift register may be employed. In such cases, the matrix row in which a particular vector value is assigned will change for different cycles.

The data rate is $K_{base}/N_{base}$. In order to achieve different data rates, either or both $K_{base}$ and $N_{base}$ may be changed. The LDPC decoder may be configurable to process multiple data rates. For example, 1/2 rate, 3/4 rate, and 7/8 rate may be employed.

Figure 3:
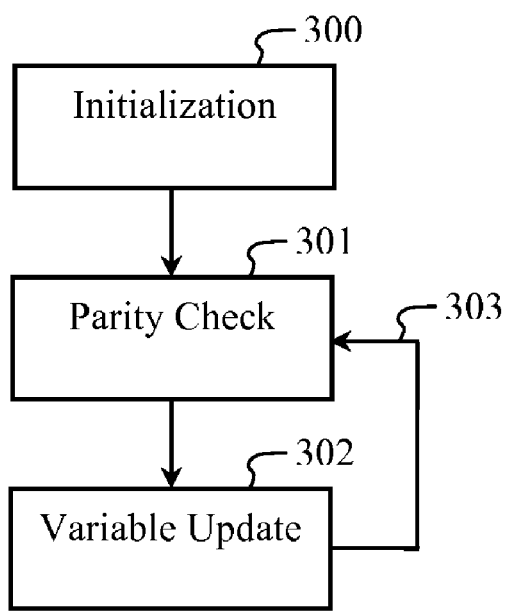
FIG. 3 is a block diagram of an LDPC decoding method in accordance with an embodiment of the invention.

FIG. 3 is a block diagram of an LDPC decoding method in accordance with an embodiment of the invention. An initialization step 300 sets variable data bits $v_0, \ldots v_{N-1}$ to received codeword values $r_0, \ldots r_{N-1}$, which may be sent to one or more parity-check processors (such as the parity-check processors 102.1-102.M shown in FIG. 1A). A parity-check step 301 calculates messages from the received variable data bits, which may be sent to one or more variable-node processors (such as the variable-node processors 101.1-101.K shown in FIG. 1A). In one example, a parity check node 0 receives variable data bits $v_0$, $v_2$, $v_4$ corresponding to equation $c_0 + c_2 + c_4 = 0$, from which it calculates messages $$E^k(0 \to 0) = 2\tanh\left[\tanh\left(\frac{v_2^{k-1}}{2}\right)\tanh\left(\frac{v_4^{k-1}}{2}\right)\right]$$

$$E^k(0 \to 2) = 2\tanh\left[\tanh\left(\frac{v_0^{k-1}}{2}\right)\tanh\left(\frac{v_4^{k-1}}{2}\right)\right]$$

$$E^k(0 \to 4) = 2\tanh\left[\tanh\left(\frac{v_0^{k-1}}{2}\right)\tanh\left(\frac{v_2^{k-1}}{2}\right)\right],$$

wherein $E^k(0 \to b)$ denotes a message sent from parity-check node 0 to variable node b.

A variable-update step 302 processes the messages $E^k$ and updates the variable data bits via any combination of hard and soft decisions. For example, variable node 0 receives messages from parity-check nodes 0 and 2 and updates an earlier variable data bit estimate $v_0^{k-1}$:

$$v_0^k = v_0^{k-1} + E^{k-1}(0 \to 0) + E^{k-1}(2 \to 0).$$

The updated variable data bit estimates may be fed back 303 to the parity-check step 301 for a predetermined number of iterations or until a predetermined criterion is met. Typically, the final variable update 302 would comprise a hard decision.

Figure 4:
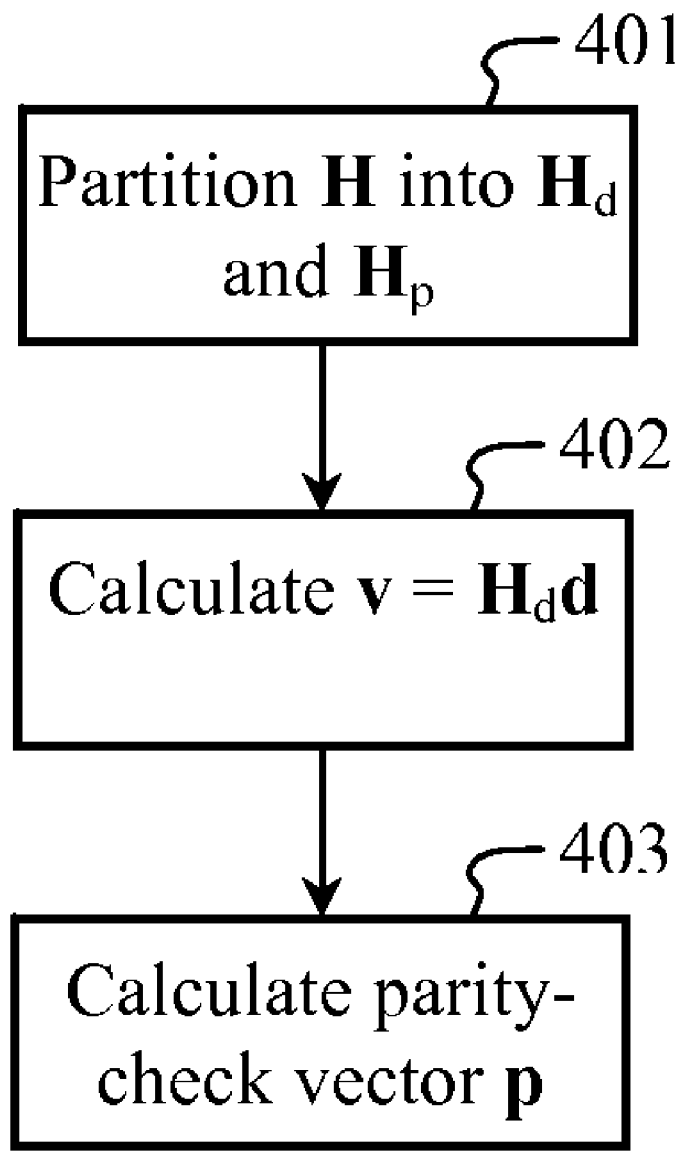
FIG. 4 is a block diagram of an efficient LDPC encoding method in accordance with an embodiment of the invention.

FIG. 4 is a block diagram of an efficient LDPC encoding method in accordance with an embodiment of the invention. A parity-check matrix H is partitioned 401 into two square matrices, $H_d$ and $H_p$:

$$H = [H_d \; H_p]$$

The definition Hc=0 of the parity check matrix requires $$[H_d \; H_p]\begin{bmatrix} d \\ p \end{bmatrix} = 0.$$

The requirement that Hc=0 can be also be expressed as $$H_p p = H_d d = v_{K \times 1},$$

where v is an intermediate vector employed for calculating the parity-check vector p. The parity-check vector p is solved by first calculating 402 the vector v defined by $v = H_d d$, wherein d and $H_d$ are known. Then $H_p p = v$ will be used to solve for p.

In one embodiment, $H_p$ comprises a triangular matrix comprising an arrangement of square sub-matrices A, B, C, D, E, F, Q, R, S, and T having non-zero values, shown as follows:

$$\begin{bmatrix} v_0 \\ v_1 \\ v_2 \\ v_3 \end{bmatrix} = \begin{bmatrix} A & 0 & 0 & 0 \\ B & C & 0 & 0 \\ D & E & F & 0 \\ Q & R & S & T \end{bmatrix}\begin{bmatrix} p_0 \\ p_1 \\ p_2 \\ p_3 \end{bmatrix}$$

In this case, v and p are represented with sub-vectors:

$$v = \begin{bmatrix} v_0 \\ v_1 \\ v_2 \\ v_3 \end{bmatrix} \text{ and } p = \begin{bmatrix} p_0 \\ p_1 \\ p_2 \\ p_3 \end{bmatrix},$$

wherein the relationship $H_p p = v$ may be expressed by $Ap_0 = v_0$ $Bp_0 + Cp_1 = v_1$ $Dp_0 + Ep_1 + Fp_2 = v_2$ $Qp_0 + Rp_1 + Sp_2 + Tp_3 = v_3$ The parity-check vector p may be calculated 403 by exploiting the triangular structure of the parity check matrix $H_p$ to generate a simple sequence of equations that are easily solved:

$p_0 = A^{-1} v_0$ $p_1 = C^{-1}(v_1 + Bp_0)$ $p_2 = F^{-1}(v_2 + Dp_0 + Ep_1)$ $p_3 = T^{-1}(v_3 + Qp_0 + Rp_1 + Sp_2)$

In embodiments of the invention, encoders and encoding methods may be configured to provide any of various coding rates, such as rate 1/2, 3/4 and 7/8 by partitioning the parity-check matrix H into a corresponding M×K matrix, $H_d$, and an M×M matrix, $H_p$. Various embodiments of the invention may comprise a digital computer system programmed to perform a method of the invention and/or a computer-readable medium storing a computer program implementing any of the methods of the inventions.

Figure 5:
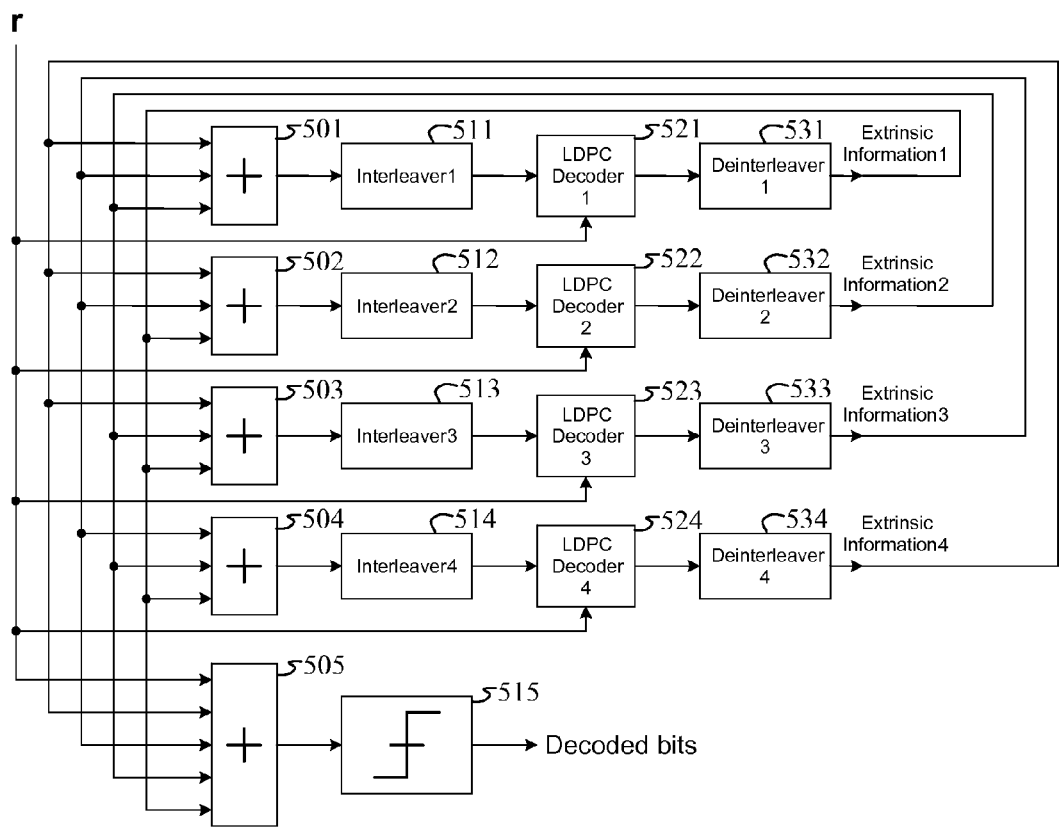
FIG. 5 illustrates a rate-1/2 decoding architecture in accordance with an embodiment of the invention.

FIG. 5 illustrates a rate-1/2 decoding architecture in accordance with an embodiment of the invention. Data bits from a received data sequence r are coupled into each of a plurality of LDPC decoders 521-524, which correspond to sub-matrices $H_{12}^1$, $H_{12}^2$, $H_{12}^3$ and $H_{12}^4$, respectively. During a first cycle, extrinsic information for all bits belonging to a first super code $c_1$ (corresponding to $H_{12}^1$) in a received data stream is computed by the first LDPC decoder 521. Similarly, extrinsic information for second, third, and fourth super codes ($c_2$, $c_3$, and $c_4$) of corresponding matrices $H_{12}^2$, $H_{12}^3$ and $H_{12}^4$ are computed by LDPC decoders 522, 523, and 524, respectively.

Extrinsic information generated by the first LDPC decoder 521 is de-interleaved by de-interleaver 531, coupled through second, third, and fourth signal combiners 502-504, and provided as a priori information to be interleaved by a plurality of interleavers 512, 513, and 514 during a subsequent cycle. Accordingly, the first signal combiner 501 is configured to combine a priori information from the other LDPC decoders 522-524, and the combined signal is interleaved by interleaver 511 prior to being processed by the first LDPC decoder 521. The first LDPC decoder 521 updates its extrinsic information.

Each of the LDPC decoders is provided with a priori information generated by the other LDPC decoders. For example, the second LDPC decoder 522 receives a priori information from decoders 521, 523, and 524 and updates its associated extrinsic reliability values. The third LDPC decoder 523 receives a priori information from decoders 521, 522, and 524 and updates its associated extrinsic reliability values. Similarly, the fourth LDPC decoder 524 receives a priori information from decoders 521-523 and updates its extrinsic reliability values. The updated extrinsic information generated during the first cycle may be repeated in subsequent cycles a predetermined number of times or until one or more measurement criteria are satisfied. When the last cycle is completed, the extrinsic information from all the decoders 521-524 is combined in combiner 505 and processed by a symbol estimator 515 to generate decoded bits.

Figure 6:
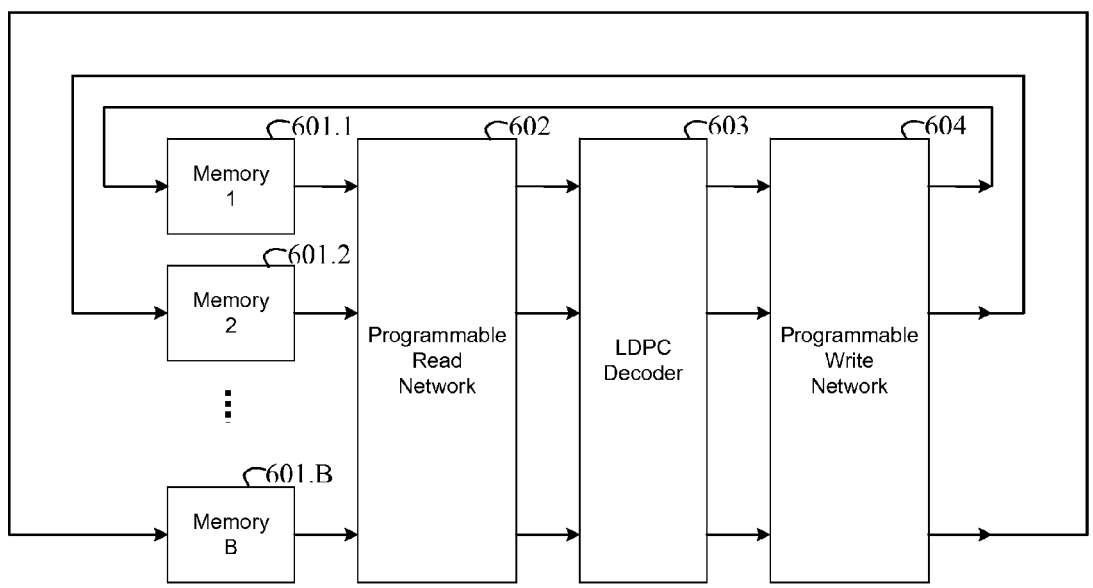
FIG. 6 is a block diagram of an LDPC decoder that may be implemented in embodiments of the invention.

FIG. 6 is a block diagram of an LDPC decoder that may be implemented in embodiments of the invention. A single LDPC decoder 603 is employed for performing a plurality of decoding operations, and all extrinsic information is stored in memory (e.g., memory banks 601.1-601.B). A programmable read network 602 is coupled between the memory banks 601.1-601.B and the LDPC decoder 603. A programmable write network 604 couples the LDPC decoder 603 to the memory banks 601.1-601.B. Variations of this decoder architecture may be employed, such as those shown in M. Mansour et al., "High-Throughput LDPC Decoders," IEEE Transactions on very large scale integration systems, Vol. 11, No. 6, December 2003, which is hereby incorporate by reference.

Figure 7A:
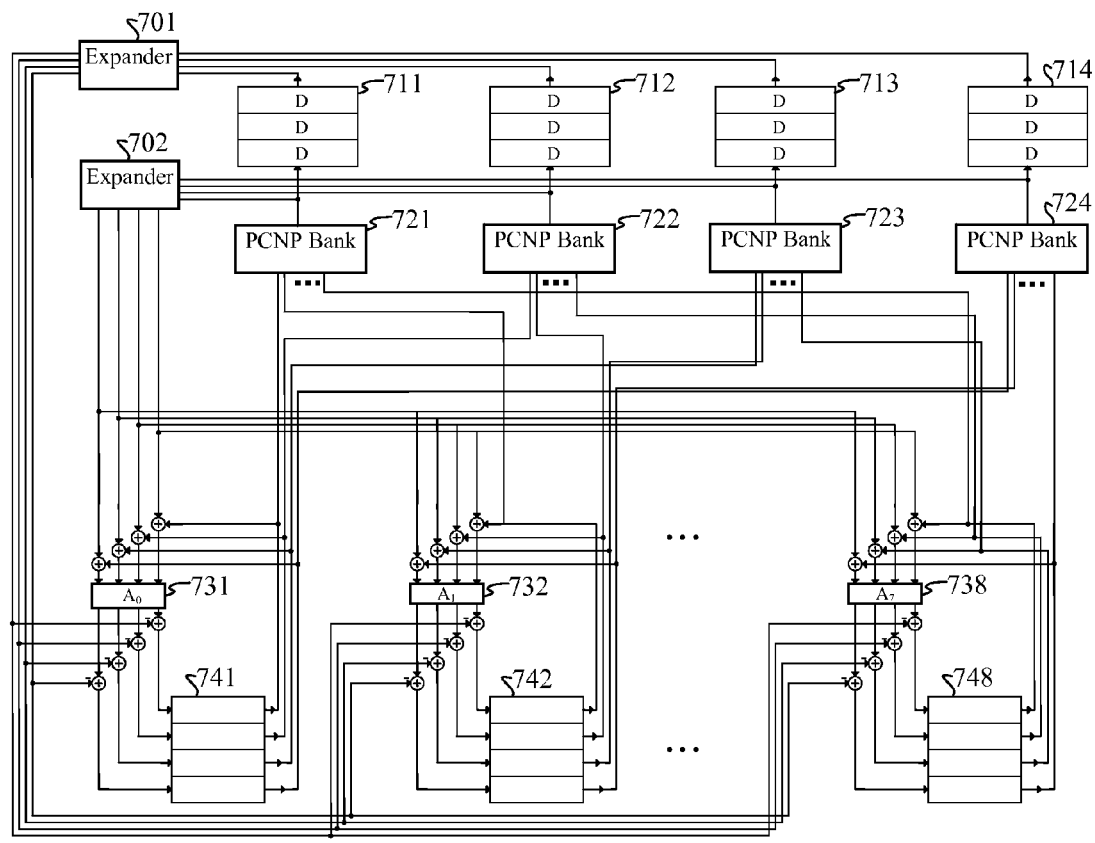
FIG. 7A is a block diagram of a high-speed turbo-LDPC decoder in accordance with an embodiment of the invention.

FIG. 7A is a block diagram of a high-speed turbo-LDPC decoder in accordance with an embodiment of the invention. The turbo-LDPC decoder iteratively decodes bits belonging to super codes $c_1$, $c_2$, $c_3$ and $c_4$ corresponding to parity-check sub-matrices, $H_{12}^1$, $H_{12}^2$, $H_{12}^3$, and $H_{12}^4$.

A received signal $r_{N \times 1}$ corresponding to a transmitted codeword $c_{N \times 1}$ is partitioned into $N_{base}$ vectors, $r_0, r_1, \ldots, r_{N_{base}}$, each of size $N_{perm} \times 1$, and coupled into a plurality of shift registers 741-748. A first bank of parity-check node processors (PCNPs) 721 contains a plurality $N_{perm}$ of PCNPs (such as depicted by PCNPs 751-760 shown in FIG. 7B) configured to process inputs comprising the first stage of each shift register 741-748 (e.g., $r_2(6), r_4(23) \ldots, r_{29}(24)$). In this case, the first PCNP 751 of the first PCNP bank 721 processes the first elements in blocks $r_2(6), r_4(23) \ldots, r_{29}(24)$). The second PCNP 752 of the first PCNP bank 721 processes the second elements in blocks $r_2(6), r_4(23) \ldots,$ and $r_{29}(24)$. The $N_{perm}{}^{th}$ PCNP 760 of the first PCNP bank 721 processes the $N_{perm}{}^{th}$ elements in blocks $r_2(6), r_4(23) \ldots,$ and $r_{29}(24)$. This enables a one-to-one indexing of the connections without reordering.

Figure 7B:
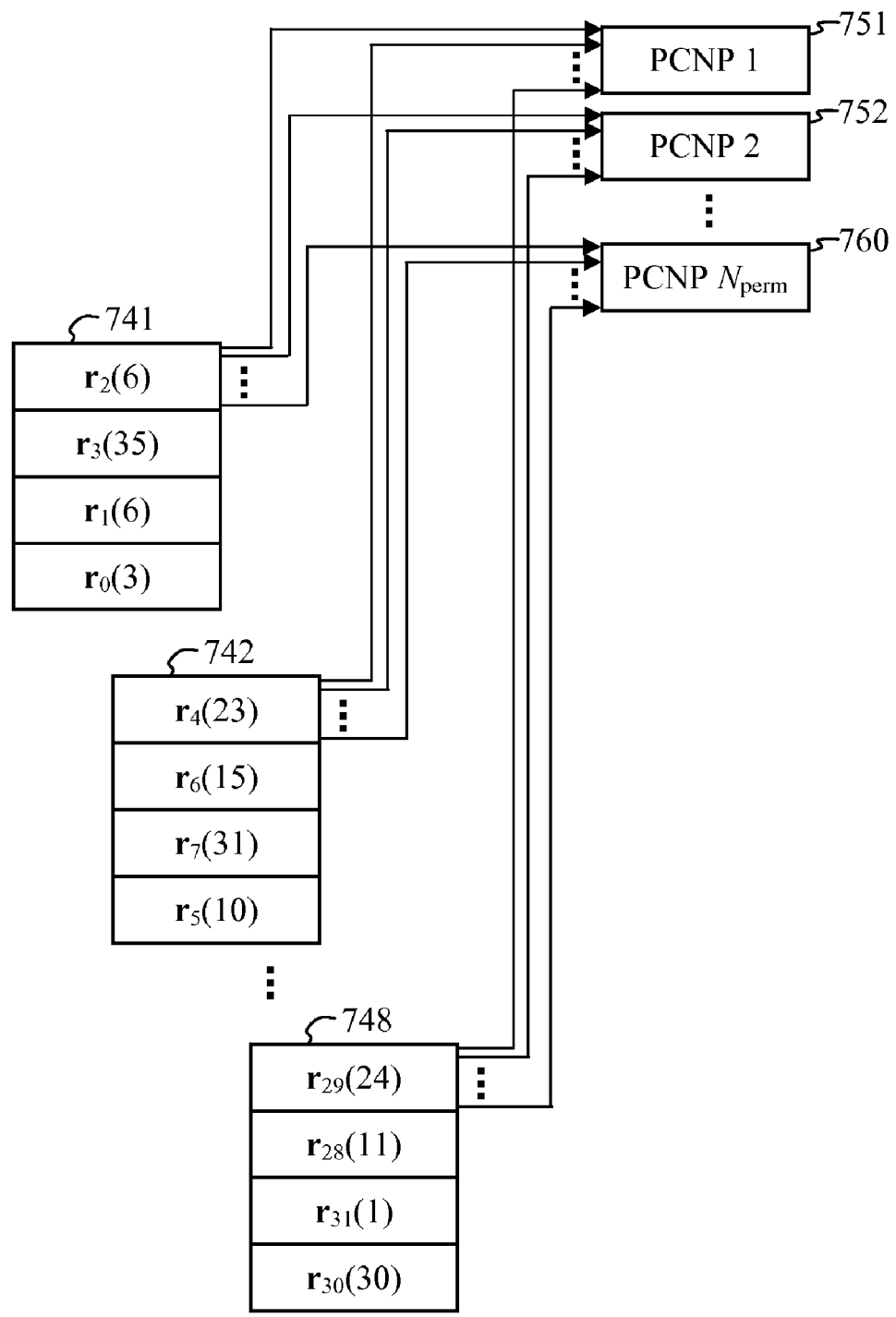
FIG. 7B is a block diagram of a bank of parity check node processors in accordance with an embodiment of the invention.

In FIG. 7B, each of the PCNPs 751-760 of the first PCNP bank 721 comprises eight inputs, which correspond to the eight block shift registers 741-748. Initially, the block shift registers are loaded with the received signal, r, such as shown in FIG. 7A. The loading may occur in one clock cycle. In an alternative embodiment, loading may occur in multiple (e.g., four) clock cycles with respect to one or more associated shift-register patterns, such as the shift-register patterns shown in FIGS. 10-15 in U.S. patent application Ser. No. 11/462,241, filed Aug. 3, 2006, which is incorporated by reference in its entirety. The shift registers 741-748 in this position correspond to the parity-check sub-matrix $H_{12}^1$, which is associated with one of four constituent decoders.

Figure 8A:
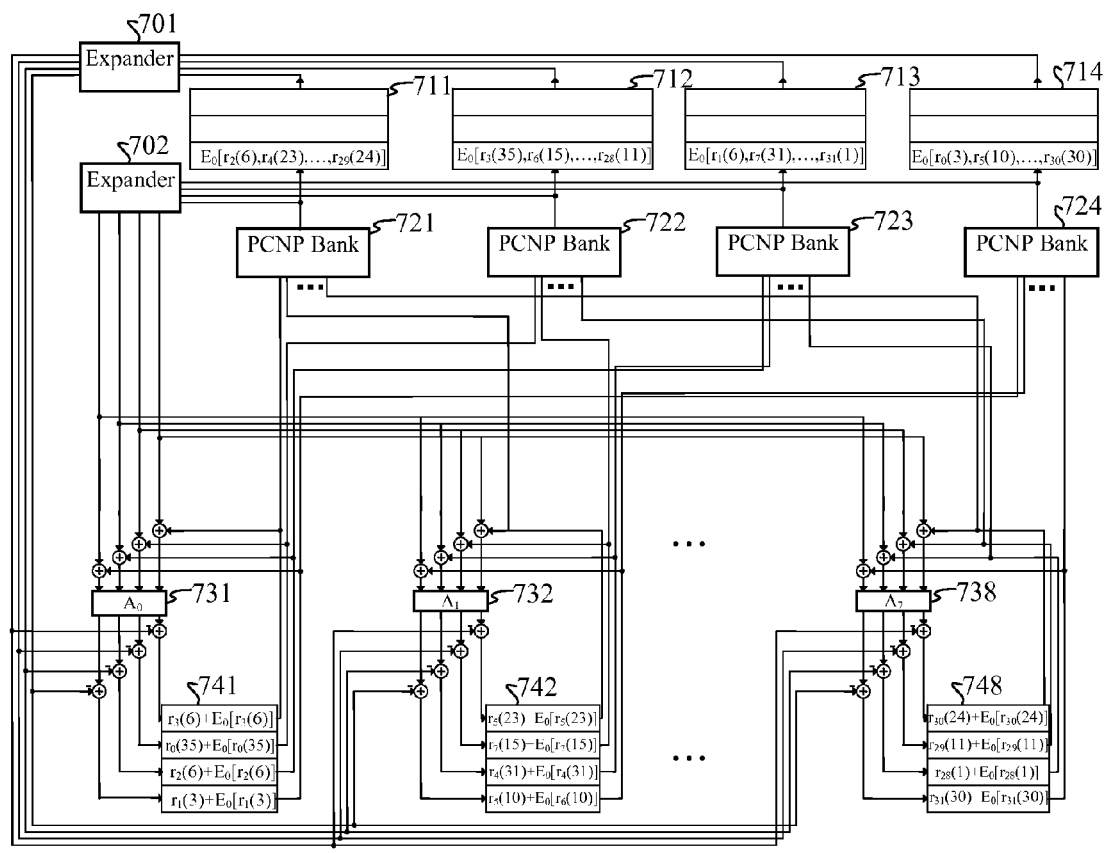
FIG. 8A illustrates a state of an LDPC decoder during a first iteration in accordance with an embodiment of the invention.

During a first iteration, which is illustrated in FIG. 8A, the LDPC decoder decodes the received data bits with respect to the first super code $c_1$ corresponding to the parity-check sub-matrix $H_{12}^1$. In this embodiment, the sub-matrix $H_{12}^1$ is characterized by $N_b=4$. Therefore, the LDPC decoder comprises four parity-check node processor banks 721-724, and each bank 721-724 comprises $N_{perm}=36$ PCNPs. The first bank 721 corresponds to the first $N_{perm}$ rows of $H_{12}^1$, the second bank 722 corresponds to the second $N_{perm}$ rows of $H_{12}^1$, the third bank 723 corresponds to the third $N_{perm}$ rows of $H_{12}^1$, and the fourth bank 724 corresponds to the fourth $N_{perm}$ rows of $H_{12}^1$.

The PCNPs process input vectors $r_0, r_1, \ldots, r_{N_{base}}$ to generate messages. For example, the first PCNP bank 721 processes $r_2(6), r_4(23) \ldots, r_{29}(24)$ to generate the message $E_0[r_2(6), r_4(23), \ldots, r_{29}(24)]$, which is stored in the first stage of a first block shift register 711. The message elements are expanded by an expander 701 and then added to the original soft bits shown in block shift register 741. The second PCNP bank 722 processes $r_3(35), r_6(15) \ldots, r_{28}(11)$ to generate the message $E_0[r_3(35), r_6(15), \ldots, r_{28}(11)]$, which is stored in the first stage of a second block shift register 712. The third PCNP bank 723 processes $r_1(6), r_7(31) \ldots, r_{31}(1)$ to generate the message $E_0[r_1(6), r_7(31), \ldots, r_{31}(1)]$, which is stored in the first stage of a third block shift register 713. The fourth PCNP bank 724 processes $r_0(3), r_5(10) \ldots, r_{30}(30)$ to generate the message $E_0[r_0(3), r_5(100), \ldots, r_{30}(30)]$, which is stored in the first stage of a fourth block shift register 714.

The messages generated by the PCNP banks 721-724 during the first iteration are expanded and then summed with the corresponding initial bit estimates to produce updated bit estimates. For example, the initial bit estimates $r_2(6)$ is updated to be $r_2(6)+E_0[r_2(6)]$. The updated bit estimates are permuted by fixed permuters 731-738, and the resulting permuted messages are coupled into block shift registers 741-748.

Figure 9A:
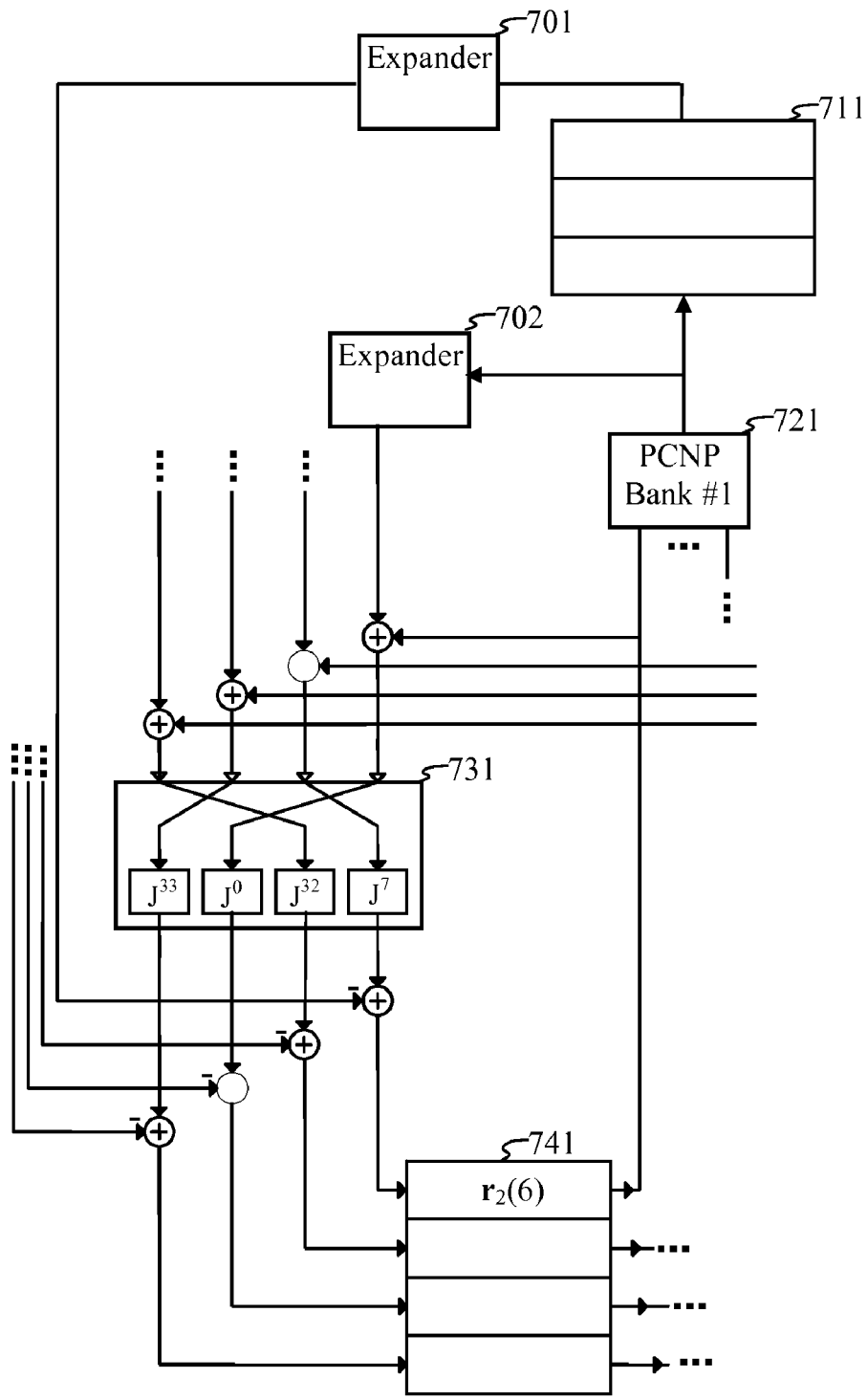
FIGS. 9A-9C illustrate how the vector $r_2(6)$ in the first stage of shift-register 741 is processed during one iteration.
Figure 9B:
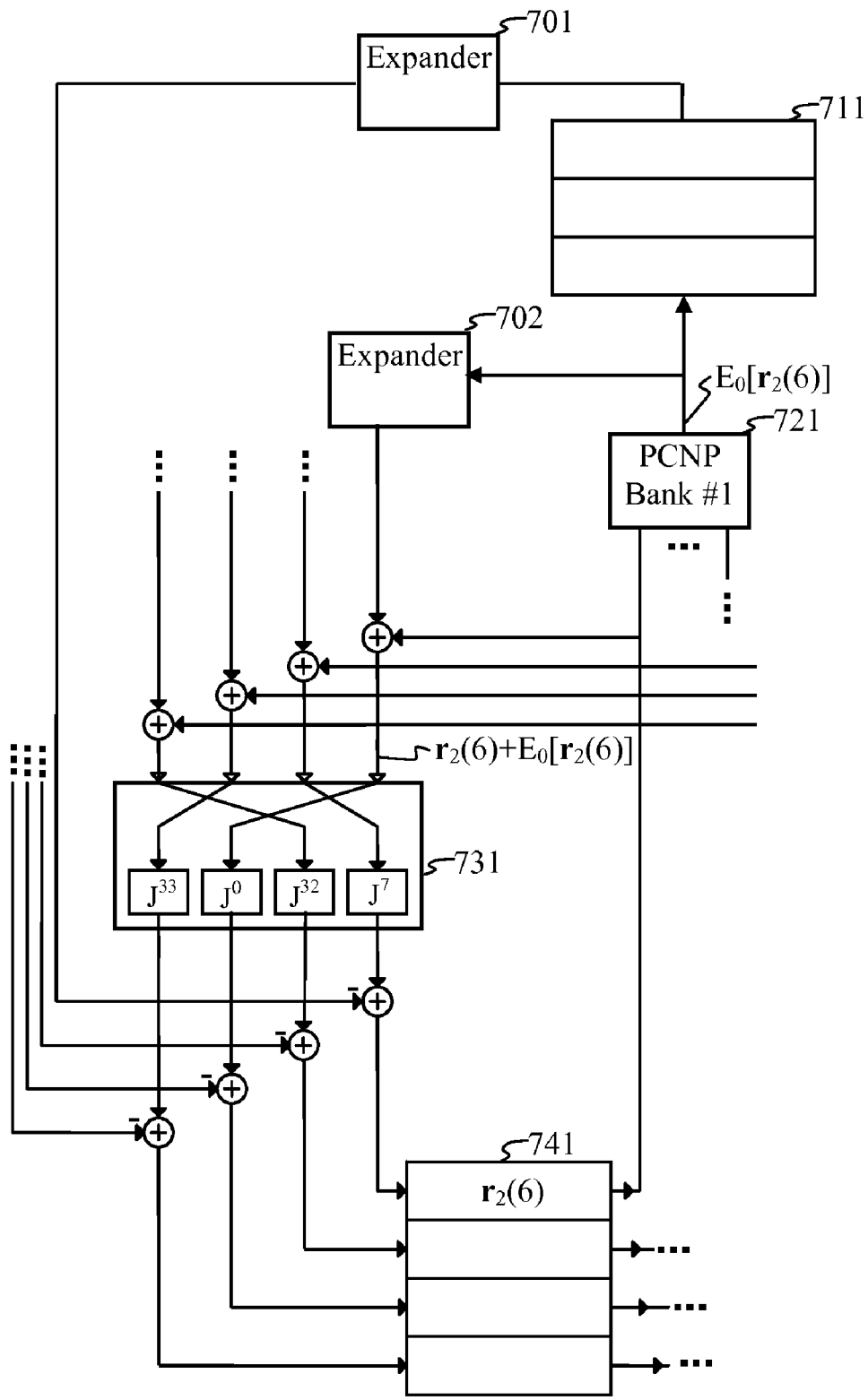
Figure 9C:
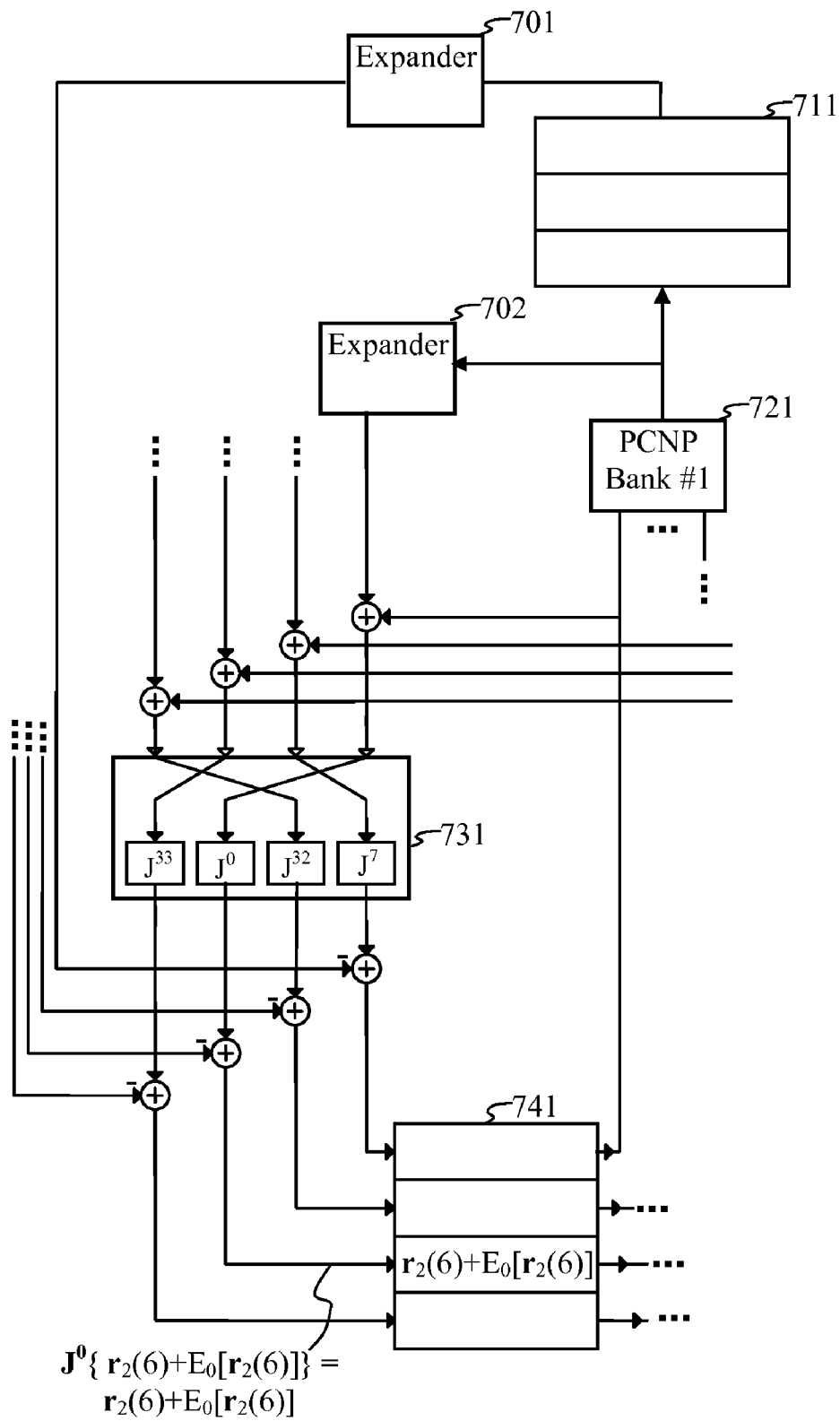

FIGS. 9A-9C illustrate how the vector $r_2(6)$ in the first stage of shift-register 741 is processed during one iteration (e.g., one clock cycle). In FIG. 9A, the received component $r_2(6)$ is coupled from the block shift register 741 to the PCNP bank 721. In FIG. 9B, the PCNP bank 721 generates a message $E_0[r_2(6)]$, which is added to $r_2(6)$ to produce updated estimate $r_2(6)+E_0[r_2(6)]$, which is then permuted via a fixed permuter 731. In FIG. 9C, the permuter 731 performs the operation $J^0\{\}$ on $r_2(6)+E_0[r_2(6)]$, which results in $r_2(6)+E_0[r_2(6)]$. This value is then coupled to the third stage of the block shift register 741.

The process illustrated in FIGS. 9A-9C also applies to the other shift-register contents. At the end of the first iteration, the contents of the shift registers 741-748 correspond to parity-check matrix $H_{12}^2$. Thus, a single LDPC decoder in accordance with embodiments of the invention may take the place of a plurality of constituent LDPC decoders.

Figure 8B:
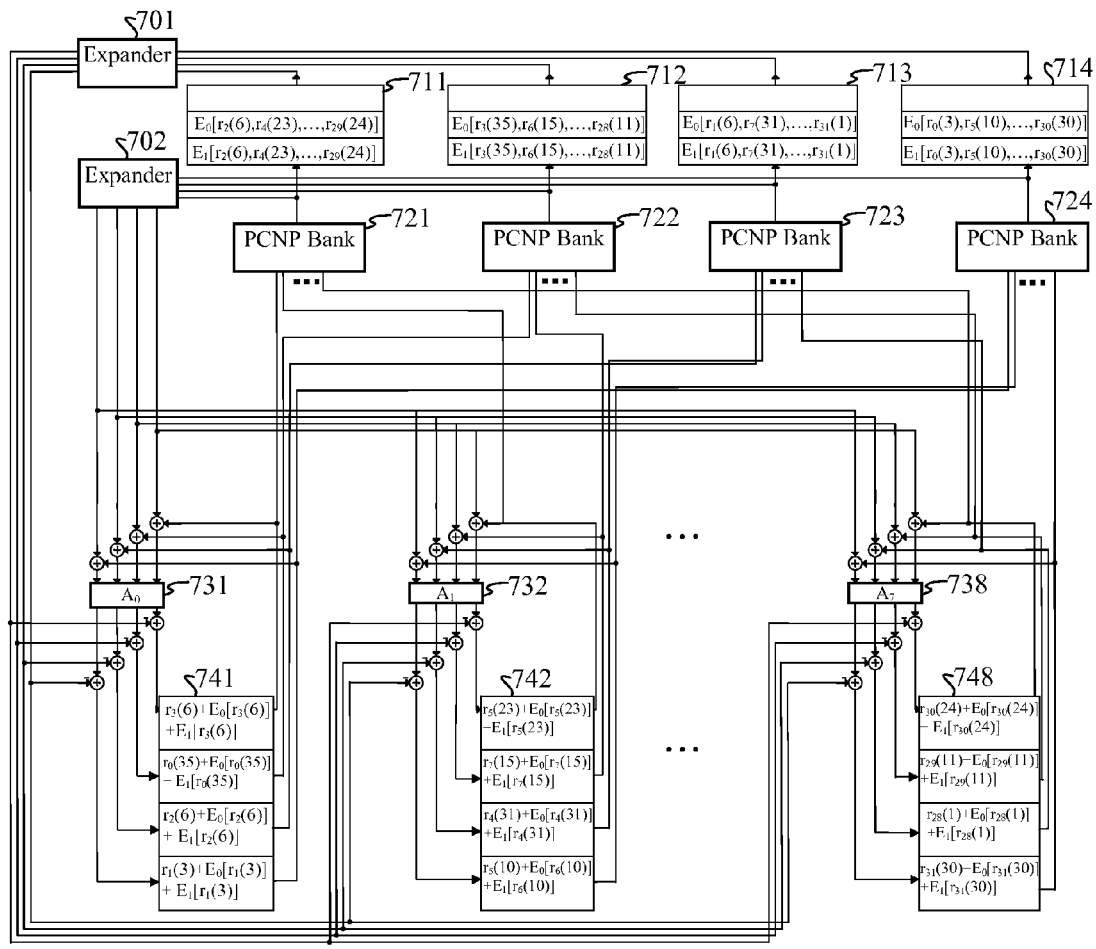
FIG. 8B illustrates a state of an LDPC decoder during a second iteration in accordance with an embodiment of the invention.

During a second iteration, which is shown in FIG. 8B, the LDPC decoder decodes the received data bits with respect to the second super code $c_2$ corresponding to the parity-check sub-matrix $H_{12}^2$. The first bank 721 corresponds to the first $N_{perm}$ rows of $H_{12}^2$, the second bank 722 corresponds to the second $N_{perm}$ rows of $H_{12}^2$, the third bank 723 corresponds to the third $N_{perm}$ rows of $H_{12}^2$, and the fourth bank 724 corresponds to the fourth $N_{perm}$ rows of $H_{12}^2$.

The first PCNP bank 721 processes $r_2(6)+E_0[r_2(6)]$, $r_4(23)+E_0[r_4(23)]$, $r_{29}(24)+E_0[r_{29}(24)]$ to generate the message $E_1[r_2(6), r_4(23), \ldots, r_{29}(24)]$, which is stored in the first stage of the first block shift register 711. The message $E_0[r_2(6), r_4(23), \ldots, r_{29}(24)]$ previously residing in the first stage is shifted to the second stage of the register 711. The second PCNP bank 722 processes $r_3(35)+E_0[r_3(35)]$, $r_6(15)+E_0[r_6(15)], \ldots, r_{28}(11)+E_0[r_{28}(11)]$ to generate the message $E_1[r_2(6), r_4(23), \ldots, r_{29}(24)]$, which is stored in the first stage of the second block shift register 721. The message $E_0[r_2(6), r_4(23), r_{29}(24)]$ is shifted from the first to the second stage of the register 712.

The third PCNP bank 723 processes $r_1(6)+E_0[r_1(6)]$, $r_7(31)+E_0[r_7(31)]$, $r_{31}(1)+E_0[r_{31}(1)]$ to generate the message $E_1[r_1(6), r_7(31), \ldots, r_{31}(1)]$, which is stored in the first stage of the third block shift register 713, whereas message $E_0[r_1(6), r_7(31), \ldots, r_{31}(1)]$ is shifted from the first stage to the second stage. The fourth PCNP bank 724 processes $r_0(3)+E_0[r_0(3)], r_5(10)+E_0[r_5(10)], \ldots, r_{30}(30)+E_0[r_{30}(30)]$ to generate the message $E_1[r_0(3), r_5(10), \ldots, r_{30}(30)]$, which is stored in the first stage, and message $E_0[r_0(3), r_5(10), \ldots, r_{30}(30)]$ is shifted from the first stage to the second stage of the fourth block shift register 714.

The messages generated by the PCNP banks 721-724 during the second iteration are expanded and then summed with corresponding bit estimates from the first iteration to produce updated bit estimates. For example, an updated bit estimate from the estimate $r_2(6)+E_0[r_2(6)]$ generated during the first iteration is $r_2(6)+E_0[r_2(6)]+E_1[r_2(6)]$. The updated bit estimates are permuted by fixed permuters 731-738, and the resulting permuted messages are coupled into block shift registers 741-748.

Figure 8C:
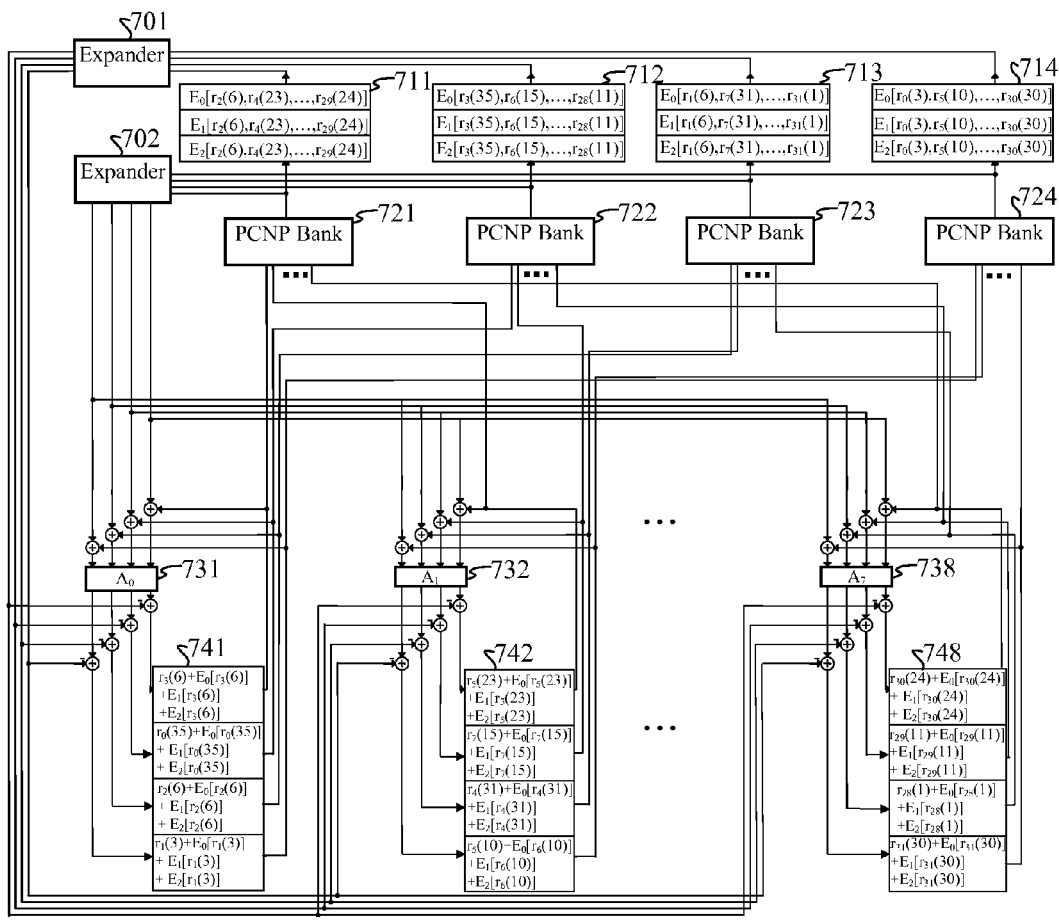
FIG. 8C illustrates a state of an LDPC decoder during a third iteration in accordance with an embodiment of the invention.

FIG. 8C illustrates the LDPC decoder state during the third iteration. The LDPC decoder decodes the received bits with respect to super code $c_3$, which corresponds to parity-check sub-matrix $H_{12}^3$. The first bank 721 corresponds to the first $N_{perm}$ rows of $H_{12}^3$, the second bank 722 corresponds to the second $N_{perm}$, rows of $H_{12}^3$, the third bank 723 corresponds to the third $N_{perm}$ rows of $H_{12}^3$, and the fourth bank 724 corresponds to the fourth $N_{perm}$ rows of $H_{12}^3$.

The first PCNP bank 721 processes $r_2(6)+E_0[r_2(6)]+E_1[r_2(6)], r_4(23)+E_0[r_4(23)]+E_1[r_4(23)], \ldots, r_{29}(24)+E_0[r_{29}(24)]+E_1[r_{29}(24)]$ to generate the message $E_2[r_2(6), r_4(23), \ldots, r_{29}(24)]$, which is stored in the first stage of the first block shift register 711. The message $E_1[r_2(6), r_4(23), \ldots, r_{29}(24)]$ previously residing in the first stage is shifted to the second stage, and the message $E_0[r_2(6), r_4(23), \ldots, r_{29}(24)]$ previously residing in the second stage is shifted to the third stage of the register 711.

The second PCNP bank 722 processes $r_3(35)+E_0[r_3(35)]+E_1[r_3(35)], r_6(15)+E_0[r_6(15)]+E_1[r_6(15)], \ldots, r_{28}(11)+E_0[r_{28}(11)]+E_1[r_{28}(11)]$ to generate the message $E_2[r_2(6), r_4(23), \ldots, r_{29}(24)]$, which is stored in the first stage of the second block shift register 721. The message $E_1[r_2(6), r_4(23), \ldots, r_{29}(24)]$ is shifted from the first to the second stage, and the message $E_0[r_2(6), r_4(23), r_{29}(24)]$ is shifted from the second stage to the third stage of the register 712.

The third PCNP bank 723 processes $r_1(6)+E_0[r_1(6)]+E_1[r_1(6)], r_7(31)+E_0[r_7(31)]+E_1[r_7(31)], \ldots, r_{31}(1)+E_0[r_{31}(1)]+E_1[r_{31}(1)]$ to generate the message $E_2[r_1(6), r_7(31), \ldots, r_{31}(1)]$, which is stored in the first stage of the third block shift register 713. The message $E_1[r, (6), r_7(31), \ldots, r_{31}(1)]$ is shifted from the first stage to the second stage, and the message $E_1[r_1(6), r_7(31), r_{31}(1)]$ is shifted from the second stage to the third stage of shift register 713.

The fourth PCNP bank 724 processes $r_0(3)+E_0[r_0(3)]+E_1[r_0(3)], r_5(10)+E_0[r_5(10)]+E_1[r_5(10)], \ldots, r_{30}(30)+E_0[r_{30}(30)]+E_1[r_{30}(30)]$ to generate the message $E_2[r_0(3), r_5(10), \ldots, r_{30}(30)]$, which is stored in the first stage of the fourth block shift register 714. The message $E_1[r_0(3), r_5(10), \ldots, r_{30}(30)]$ is shifted from the first stage to the second stage, and the message $E_0[r_0(3), r_5(10), \ldots, r_{30}(30)]$ is shifted from the second stage to the third stage of the fourth block shift register 714.

The messages generated by the PCNP banks 721-724 during the third iteration are expanded and then summed with corresponding bit estimates from the second iteration to produce updated bit estimates. For example, an updated estimate for the previous estimate $r_2(6)+E_0[r_2(6)]+E_1[r_2(6)]$ is $r_2(6)+E_0[r_2(6)]+E_1[r_2(6)]+E_2[r_2(6)]$. The updated bit estimates are permuted by fixed permuters 731-738, and the resulting permuted messages are coupled into block shift registers 741-748.

Figure 8D:
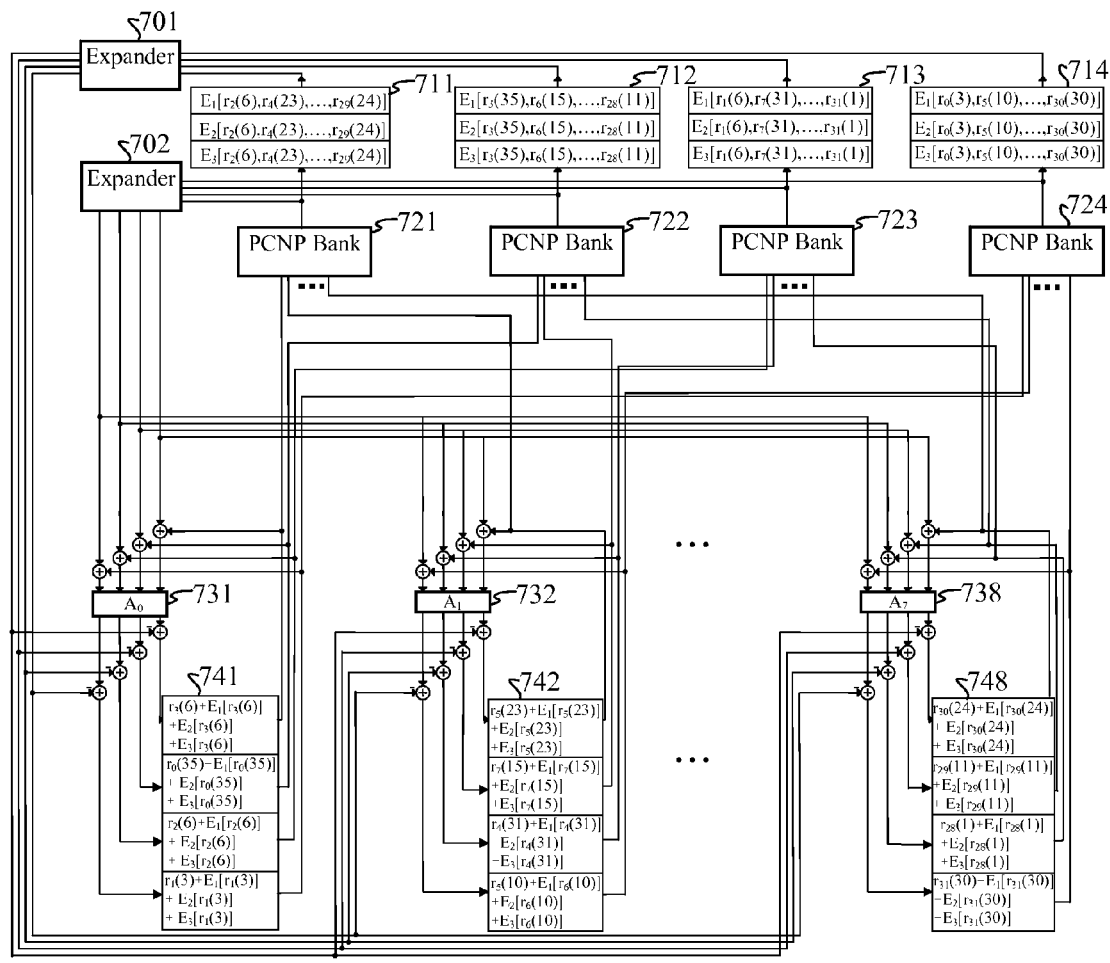
FIG. 8D illustrates a state of an LDPC decoder during a fourth iteration in accordance with an embodiment of the invention.

FIG. 8D illustrates the LDPC decoder's state during the fourth iteration. The LDPC decoder decodes the received bits with respect to super code $c_4$ corresponding to the parity-check sub-matrix, $H_{12}{}^4$. The first bank 721 corresponds to the first $N_{perm}$ rows of $H_{12}{}^4$, the second bank 722 corresponds to the second $N_{perm}$ rows of 112 the third bank 723 corresponds to the third $N_{perm}$ rows of $H_{12}{}^4$, and the fourth bank 724 corresponds to the fourth $N_{perm}$ rows of $H_{12}{}^3$.

The first PCNP bank 721 processes $r_2(6)+E_0[r_2(6)]+E_1[r_2(6)]+E_2[r_2(6)]$, $r_4(23)+E_0[r_4(23)]+E_1[r_4(23)]+E_2[r_4(23)]$, ..., $r_{29}(24)+E_0[r_{29}(24)]+E_1[r_{29}(24)]+E_2[r_{29}(24)]$ to generate the message $E_3[r_2(6), r_4(23), \ldots, r_{29}(24)]$, which is stored in the first stage of the first block shift register 711. The message $E_2[r_2(6), r_4(23), \ldots, r_{29}(24)]$ previously residing in the first stage is shifted to the second stage, the message $E_1[r_2(6), r_4(23), r_{29}(24)]$ previously residing in the second stage is shifted to the third stage.

The message $E_0[r_2(6), r_4(23), r_{29}(24)]$ previously residing in the third stage is coupled out of the register 711, expanded by expander 702, and then subtracted from permuted updated bit estimates generated in the fourth iteration. For example, an initial updated estimate for the previous estimate $r_2(6)+E_0[r_2(6)]+E_1[r_2(6)]+E_2[r_2(6)]$ is $r_2(6)+E_0[r_2(6)]+E_1[r_2(6)]+E_2[r_2(6)]+E_3[r_2(6)]$. The initial updated bit estimates are permuted by fixed permuters 731-738, and the message $E_0[r_2(6)]$ is subtracted from the resulting permuted bit estimates, producing final updated bit estimates, which are stored in the block shift registers 741-748. The stored values are used by the LDPC decoder in the fifth iteration, and these steps are repeated for subsequent iterations. Thus, the LDPC decoder depicted in this embodiment removes extrinsic information (i.e., messages) generated by the PCNP banks 721-724 three cycles earlier.

The second PCNP bank 722 processes $r_3(35)+E_0[r_3(35)]+E_1[r_3(35)]+E_2[r_3(35)]$, $r_6(15)+E_0[r_6(15)]+E_1[r_6(15)]+E_2[r_6(15)]$, ..., $r_{29}(11)+E_0[r_{29}(11)]+E_1[r_{28}(11)]+E_2[r_{28}(11)]$ to generate the message $E_3 [r_2(6), r_4(23), \ldots, r_{29}(24)]$, which is stored in the first stage of the second block shift register 721. The message $E_2 [r_2(6), r_4(23), \ldots, r_{29}(24)]$ is shifted from the first to the second stage, and the message $E_1[r_2(6), r_4(23), r_{29}(24)]$ is shifted from the second stage to the third stage of the register 712. The message $E_0[r_2(6), r_4(23), \ldots, r_{29}(24)]$ is coupled out of the register 712, expanded by expander 701, and subtracted from permuted bit estimates for producing updated bit estimates.

The third PCNP bank 723 processes $r_1(6)+E_0[r_1(6)]+E_1[r_1(6)]+E_2[r_1(6)]$, $r_7(31)+E_0[r_7(31)]+E_1[r_7(31)]+E_2[r_7(31)]$, ..., $r_{31}(1)+E_0[r_{31}(1)]+E_1[r_{31}(1)]+E_2[r_{31}(1)]$ to generate the message $E_3 [r_1(6), r_7(31), \ldots, r_{31}(1)]$, which is stored in the first stage of the third block shift register 713. The message $E_2[r_1(6), r_7(31), \ldots, r_{31}(1)]$ is shifted from the first stage to the second stage, and the message $E_1[r_1(6), r_7(31), \ldots, r_{31}(1)]$ is shifted from the second stage to the third stage of shift register 713. The message $E_0[r_1(6), r_7(31), \ldots, r_{31}(1)]$ is coupled out of the register 713, expanded by expander 701, and subtracted from permuted bit estimates for producing updated bit estimates.

The fourth PCNP bank 724 processes $r_0(3)+E_0[r_0(3)]+E_1[r_0(3)]+E_2[r_0(3)]$, $r_5(10)+E_0[r_5(10)]+E_1[r_5(10)]+E_2[r_5(10)]$, ..., $r_{30}(30)+E_0[r_{30}(30)]+E_1[r_{30}(30)]+E_2[r_{30}(30)]$ to generate the message $E_3[r_0(3), r_5(10), \ldots, r_{30}(30)]$, which is stored in the first stage of the fourth block shift register 714. The message $E_2 [r_0(3), r_5(1) \ldots, r_{30}(30)]$ is shifted from the first stage to the second stage, and the message $E_1[r_0(3), r_5(10), \ldots, r_{30}(30)]$ is shifted from the second stage to the third stage of the fourth block shift register 714. The message $E_0[r_0(3), r_5(10), \ldots, r_{30}(30)]$ is coupled out of the register 714, expanded by expander 701, and subtracted from permuted bit estimates for producing updated bit estimates.

Some advantageous features of the decoder architecture depicted in the drawings and described herein include a simple, low-cost memory architecture, and simple fixed connections. Furthermore, embodiments of the invention may be configured to avoid the need for complex read/write networks or complex programmable permuters. Additional features and advantages of embodiments of the invention will be appreciated by those skilled in the art.

In one embodiment of the invention, each PCNP is configured to function as follows. Signal inputs to a PCNP are denoted as $i_1, i_2, \ldots, i_8$, wherein each input has a signed magnitude representation $i_k=[s_k a_k]$, where $s_k$ is a sign bit (e.g., 0 if positive and 1 if negative) and $a_k$ represents the reliability of the input. Each magnitude $a_k$ may be expressed as a binary representation of m bits written as $a_k(1:m)$, where $a_k(1)$ represents the most significant bit (msb) and $a_k(m)$ represents the least significant bit (lsb). The PCNP takes 8 inputs $i_1, i_2, \ldots, i_8$ and generates eight outputs $o_1, o_2, \ldots, o_8$.

In prior-art LDPC implementations, the eight outputs $o_1, o_2, \ldots, o_8$ are stored and the computation involved is complex.

Figure 10:
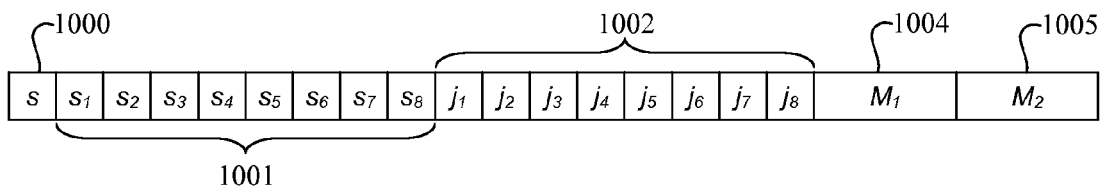
FIG. 10 shows a frame format for a compressed PCNP signal output in accordance with an embodiment of the invention.

FIG. 10 shows a frame format for a compressed PCNP signal output in accordance with an embodiment of the invention. The frame format includes an s bit 1000 that is the XOR of input sign bits $s_1, \ldots, s_8$ 1001, and is denoted by $$s = s_1 \oplus s_2 \oplus \ldots \oplus s_8.$$

The frame format also includes symbols $M_1$ 1004 and $M_2$ 1005, which are the first and second minima, respectively, of the sorted list of $a_1, \ldots, a_8$, and can be expressed as $$M_1 = \min\{a_1, a_2, \ldots, a_8\}, M_2 = \min_{n=1:8, n \neq location\ of\ M_1} \{a_n\}.$$

Figure 11:
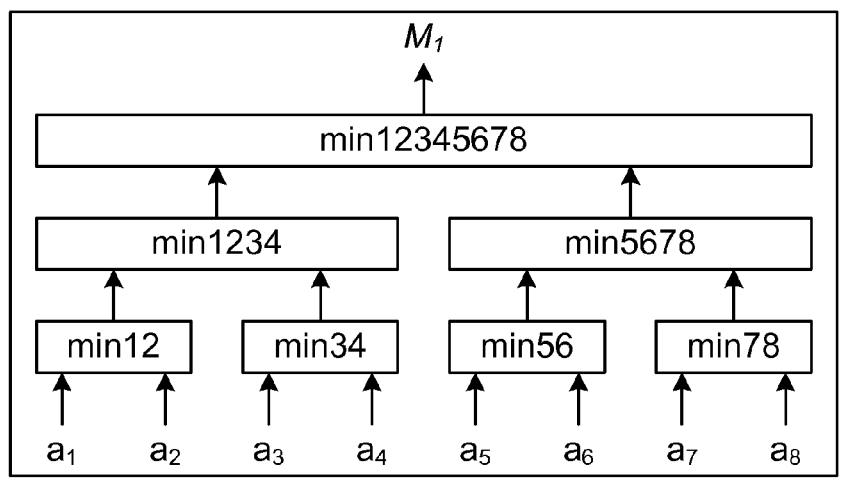
FIG. 11 illustrates a method for computing first and second minima in accordance with an embodiment of the invention.

In one embodiment of the invention, $M_1$ may be computed using a standard registered or non-registered minimum tree, such as shown in FIG. 11. Similarly, $M_2$ may be computed by duplicating the process shown in FIG. 11, but excluding the $a_k$ input corresponding to $M_1$.

Figure 12:
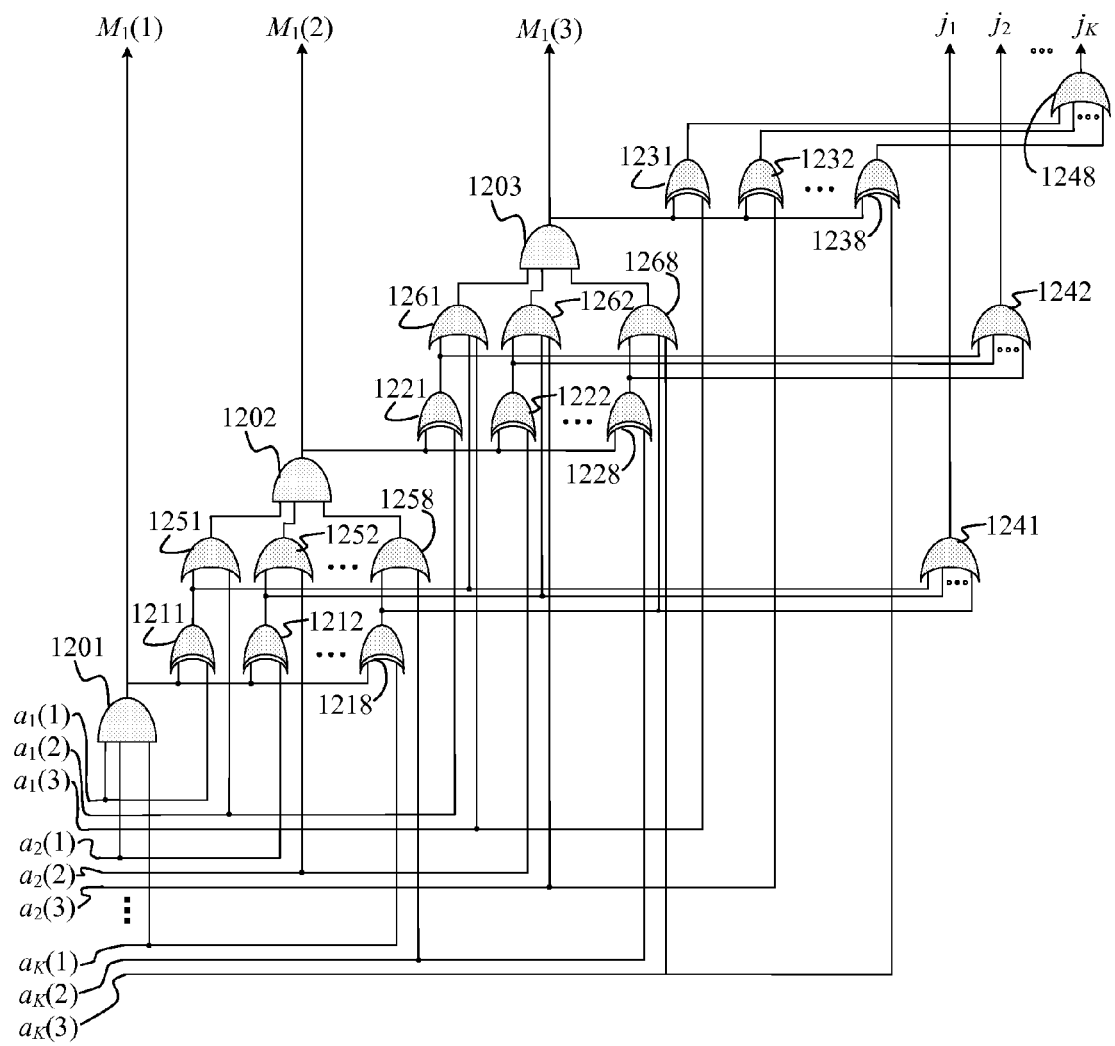
FIG. 12 illustrates an alternative method for computing first and second minima in accordance with an embodiment of the invention.

FIG. 12 illustrates an alternative embodiment of the invention that provides for an efficient computation of $M_1$ and $M_2$ (K=8) to reduce storage requirements. This embodiment may be implemented using any combination of hardware and software. A first AND gate 1201 provides a logical AND function on inputs $a_1(1), a_2(1), \ldots, a_K(1)$ to produce the first minimum, $M_1(1)$, expressed by $$M_1(1) = \prod_{k=1}^{K} a_k(1) \leftarrow msb,$$

where $\Pi$ indicates the logical AND function.

A first set of XOR gates 1211-1218 is coupled to the output of the AND gate 1201 and inputs $a_k(1)$, k=1, ..., K. For example, XOR gate 1211 provides a logical XOR operation on $M_1(1)$ and $a_1(1)$ to produce $t_1(1)$, XOR gate 1212 provides a logical XOR operation on $M_1(1)$ and $a_2(1)$ to produce $t_2(1)$, and XOR gate 1218 provides a logical XOR operation on $M_1(1)$ and $a_K(1)$ to produce $t_K(1)$.

$$t_k(1) = M_1(1) \oplus a_k(1), \text{ for } k=1, \ldots, K.$$

All K of the $t_k(1)$ values are summed in adder 1241 to produce indicator bit $j_1$.

The minimum $M_1(2)$ is produced by summing the $t_k(1)$ and $a_k(2)$ values in adders 1251-1258 for each k to generate a plurality K of summed values, followed by inputting the summed values $[t_k(1)+a_k(2)]$ into a second AND gate 1202, which provides a logical AND function on the summed values and is expressed by $$M_1(2) = \prod_{k=1}^{K} [t_k(1) + a_k(2)].$$

A second set of XOR gates 1221-1228 is coupled to the output of the AND gate 1202 and inputs $a_k(2)$, k=1, ..., K. XOR gate 1221 is configured to perform a logical XOR operation on $M_1(2)$ and $a_1(2)$ to produce $t_1(2)$, XOR gate 1222 performs a logical XOR operation on $M_1(2)$ and $a_2(2)$ to produce $t_2(2)$, and XOR gate 1228 performs a logical XOR operation on $M_1(2)$ and $a_K(2)$ to produce $t_K(2)$. The output of the second set of XOR gates 1221-1228 is $$t_k(2) = M_1(2) \oplus a_k(2), \text{ for } k=1, \ldots, K.$$

All K of the $t_k(2)$ values are summed in adder 1242 to produce a second indicator bit $j_2$.

A plurality K of adders 1261-1268 are coupled to the outputs of the second set of XOR gates 1221-1228, the first set of XOR gates 1211-1218, and inputs $a_k(2)$, k=1, ..., K. The outputs of the adders 1261-1268 (expressed by $[t_k(1)+t_k(2)+a_k(3)]$) are processed by a third AND gate 1203 configured for performing a logical AND operation. The output of the AND gate 1203 is the minimum $M_1(3)$, which is expressed by $$M_1(3) = \prod_{k=1}^{K} [t_k(1) + t_k(2) + a_k(3)].$$

A third set of XOR gates 1231-1238 is coupled to the output of the AND gate 1203 and inputs $a_k(3)$, k=1, ..., K. XOR gate 1231 is configured to perform a logical XOR operation on $M_1(3)$ and $a_1(3)$ to produce $t_1(2)$, XOR gate 1232 performs a logical XOR operation on $M_1(3)$ and $a_2(3)$ to produce $t_2(2)$, and XOR gate 1238 performs a logical XOR operation on $M_1(3)$ and $a_K(3)$ to produce $t_K(2)$. Thus, the output of the third set of XOR gates 1231-1238 is $$t_k(3) = M_1(3) \oplus a_k(3), \text{ for } k=1, \ldots, K.$$

All K of the $t_k(3)$ values are summed in adder 1243 to produce a third indicator bit $j_3$.

Since each of the indicator bits $j_1, \ldots, j_K$ 1002 is computed using $$j_k = t_k(1) + t_k(2) + \ldots + t_k(m) \text{ for } k=1, \ldots, K,$$

the set of indicator bits $j_k$ 1002 shown in FIG. 10 are configured to indicate which of a set of reliability values $a_k$ corresponds to $M_1$ ($j_k=1$) or does not ($j_k=0$)

$$j_k = \begin{cases} 1 & a_k = M_1 \\ 0 & a_k \neq M_1 \end{cases}$$

This compression can greatly reduce memory requirements.

For the computation of $M_2$, a function $f(.)$ is defined as $$f(x_{1:K}) \equiv f(x_1, x_2, \ldots, x_K) = \sum_{k=1}^{K} \prod_{n=1, n \neq k}^{K} x_n,$$

where $\Sigma$ indicates the function of an OR gate, and $$M_2(1) = f(a_{1:K}(1)) = f(a_1(1), a_2(1), \ldots, a_K(1))$$

$$M_2(2) = \bar{q}_1 f(v_{1:K}(1)) + q_1 \prod_{k=1}^{K} v_k(1)$$

$$M_2(3) = \bar{q}_1 \bar{q}_2 f(v_{1:K}(2)) + (q_1 + q_2) \prod_{k=1}^{K} v_k(2)$$

$$M_2(4) = \bar{q}_1 \bar{q}_2 \bar{q}_3 f(v_{1:K}(3)) + (q_1 + q_2 + q_3) \prod_{k=1}^{K} v_k(3)$$

where
$q_1 = M_1(1) \oplus M_2(1); u_k(1) = M_2(1) \oplus a_k(1) \& v_k(1) = u_k(1) + a_k(2)$ for k=1, ..., K
$q_2 = M_1(2) \oplus M_2(2); u_k(2) = M_2(2) \oplus a_k(2) \& v_k(2) = u_k(1) + u_k(2) + a_k(3)$ for k=1, ..., K
$q_3 = M_1(3) \oplus M_2(3); u_k(3) = M_2(3) \oplus a_k(3) \& v_k(3) = u_k(1) + u_k(2) + u_k(3) + a_k(4)$ for k=1, ..., K
and $\bar{q} = 1-q$.

An expander (such as either of the expanders 701 and 702) processes the compressed PCNP output signal to compute the output signal $o_1, o_2, \ldots, o_8$. For example, the expander may be configured to perform the operation $$o_k = [\, s \oplus s_k \quad j_k M_1 + \bar{j}_k M_2 \,].$$
$$\phantom{o_k = [\,} \uparrow \phantom{s \oplus s_k \quad} \uparrow$$
$$\phantom{o_k = [\,} \text{sign} \phantom{s \oplus s_k} \text{magnitude}$$

Figure 13A:
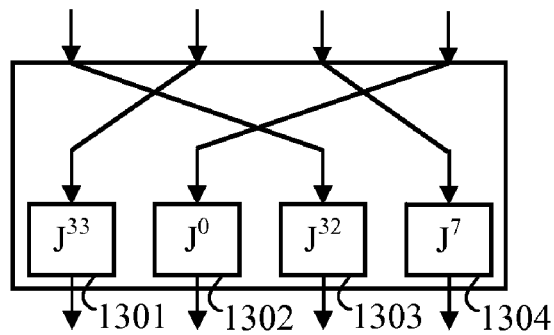
FIGS. 13A-13C are block diagrams of permuters having fixed connections in accordance with an embodiment of the invention.

FIG. 13A illustrates a first permuter, such as permuter 731 shown in FIG. 8A, having fixed connections in accordance with an embodiment of the invention. The first permuter comprises a plurality of vector inputs (an initial column vector) having fixed connections to a plurality of matrix operators 1301, 1302, 1303, and 1304 corresponding to shifted Identity matrices $J^{33}$, $J^0$, $J^{32}$, and $J^7$, respectively. The function of the first permuter may be represented by matrix $A_0$, wherein $$A_0 = \begin{bmatrix} 0 & J^7 & 0 & 0 \\ 0 & 0 & 0 & J^{32} \\ J^0 & 0 & 0 & 0 \\ 0 & 0 & J^{33} & 0 \end{bmatrix}.$$

The function of matrix $A_0$ is expressed by $$\begin{bmatrix} r_3(06) \\ r_0(35) \\ r_2(06) \\ r_1(03) \end{bmatrix} = \begin{bmatrix} 0 & J^7 & 0 & 0 \\ 0 & 0 & 0 & J^{32} \\ J^0 & 0 & 0 & 0 \\ 0 & 0 & J^{33} & 0 \end{bmatrix} \begin{bmatrix} r_2(06) \\ r_3(35) \\ r_1(06) \\ r_0(03) \end{bmatrix},$$

which operates on the initial column vector to produce a final column vector.

The matrix $A_0$ represents fixed connections (i.e., permutations) used to align messages from the PCNPs with the soft-decision estimates of bits $r_0, \ldots, r_3$ before the messages and estimates are added. Specifically, $r_3(35)$ is shifted by $J^7$ to produce $r_3(06)$ and moved from the second row of the initial column vector to the first row of the final column vector. The fourth row element, $r_0(03)$ is shifted by $J^{32}$ to produce $r_0(35)$, which is placed in the second row of the final column vector. The first row element $r_2(06)$ does not undergo a shift, but is relocated from the first row of the initial column vector to the third row of the final column vector. The third row element $r_1(06)$ is shifted by $J^{33}$ to produce $r_1(03)$, which is stored as the fourth row of the final column vector.

Figure 13B:
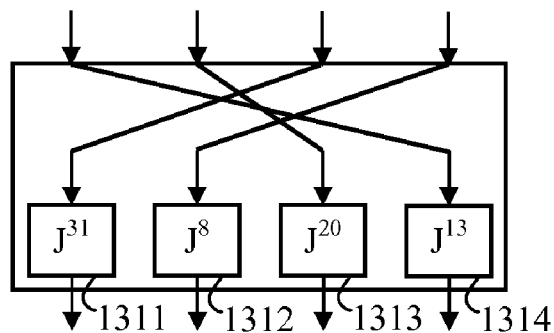

FIG. 13B illustrates a second permuter, such as permuter 732 shown in FIG. 8A, having fixed connections in accordance with an embodiment of the invention. The second permuter comprises a plurality of vector inputs (an initial column vector) having fixed connections to a plurality of matrix operators 1311, 1312, 1313, and 1314 corresponding to shifted Identity matrices $J^{31}$, $J^8$, $J^{20}$, and $J^{13}$, respectively. The function of the second permuter may be represented by matrix $A_1$, wherein $$A_1 = \begin{bmatrix} 0 & 0 & 0 & J^{13} \\ 0 & 0 & J^{20} & 0 \\ J^8 & 0 & 0 & 0 \\ 0 & J^{31} & 0 & 0 \end{bmatrix}.$$

The function of matrix $A_1$ is expressed by $$\begin{bmatrix} r_5(23) \\ r_7(15) \\ r_4(31) \\ r_6(10) \end{bmatrix} = \begin{bmatrix} 0 & 0 & 0 & J^{13} \\ 0 & 0 & J^{20} & 0 \\ J^8 & 0 & 0 & 0 \\ 0 & J^{31} & 0 & 0 \end{bmatrix} \begin{bmatrix} r_4(23) \\ r_6(15) \\ r_7(31) \\ r_5(10) \end{bmatrix},$$

which operates on the initial column vector to produce a final column vector.

The matrix $A_1$ represents fixed connections (i.e., permutations) used to align messages from the PCNPs with the soft-decision estimates of bits $r_4, \ldots, r_7$ before the messages and estimates are added. Specifically, $r_5(10)$ is shifted by $J^{13}$ to produce $r_5(23)$ and moved from the fourth row of the initial column vector to the first row of the final column vector. The third row element, $r_7(31)$ is shifted by $J^{20}$ to produce $r_7(15)$, which is placed in the second row of the final column vector. The first row element $r_4(23)$ is shifted by $J^8$ to produce $r_4(31)$ and relocated to the third row of the final column vector. The second row element $r_6(15)$ is shifted by $J^{31}$ to produce $r_6(10)$, which is stored as the fourth row of the final column vector.

Figure 13C:
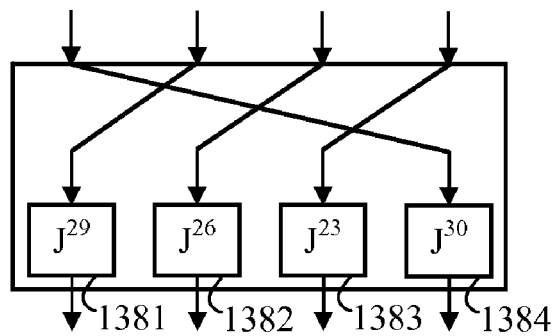

FIG. 13C illustrates an eighth permuter, such as permuter 738 shown in FIG. 8A, having fixed connections in accordance with an embodiment of the invention. The eighth permuter comprises a plurality of vector inputs (an initial column vector) having fixed connections to a plurality of matrix operators 1381, 1382, 1383, and 1384 corresponding to shifted Identity matrices $J^{29}$, $J^{26}$, $J^{23}$, and $J^{30}$, respectively. The function of the eighth permuter may be represented by matrix $A_7$, wherein $$A_7 = \begin{bmatrix} 0 & 0 & 0 & J^{30} \\ J^{23} & 0 & 0 & 0 \\ 0 & J^{26} & 0 & 0 \\ 0 & 0 & J^{29} & 0 \end{bmatrix}.$$

The function of matrix $A_7$ is expressed by $$\begin{bmatrix} r_{30}(24) \\ r_{29}(11) \\ r_{28}(01) \\ r_{31}(30) \end{bmatrix} = \begin{bmatrix} 0 & 0 & 0 & J^{30} \\ J^{23} & 0 & 0 & 0 \\ 0 & J^{26} & 0 & 0 \\ 0 & 0 & J^{29} & 0 \end{bmatrix} \begin{bmatrix} r_{29}(24) \\ r_{28}(11) \\ r_{31}(01) \\ r_{30}(30) \end{bmatrix},$$

which operates on the initial column vector to produce a final column vector.

The matrix $A_7$ represents fixed connections (i.e., permutations) used to align messages from the PCNPs with the soft-decision estimates of bits $r_{28}, \ldots, r_{31}$ before the messages and estimates are added. Specifically, $r_{30}(30)$ is shifted by $J^{30}$ to produce $r_{30}(24)$ and moved from the fourth row of the initial column vector to the first row of the final column vector. The first row element, $r_{29}(24)$ is shifted by $J^{23}$ to produce $r_{29}(11)$, which is placed in the second row of the final column vector. The second row element $r_{28}(11)$ is shifted by $J^{26}$ to produce $r_{28}(01)$ and relocated to the third row of the final column vector. The third row element $r_{31}(30)$ is shifted by $J^{29}$ to produce $r_{31}(30)$, which is stored as the fourth row of the final column vector.

The permutation matrices $A_0, A_1, \ldots, A_7$ do not change from one iteration to another, and therefore represent fixed connections that align the messages from the PCNPs 721-724 with the soft-decision estimates of bits $r_0, \ldots, r_{31}$. These fixed connections simplify interconnections in LDPC, enable reduced decoder complexity, and allow for higher decoding speeds.

Figure 14:
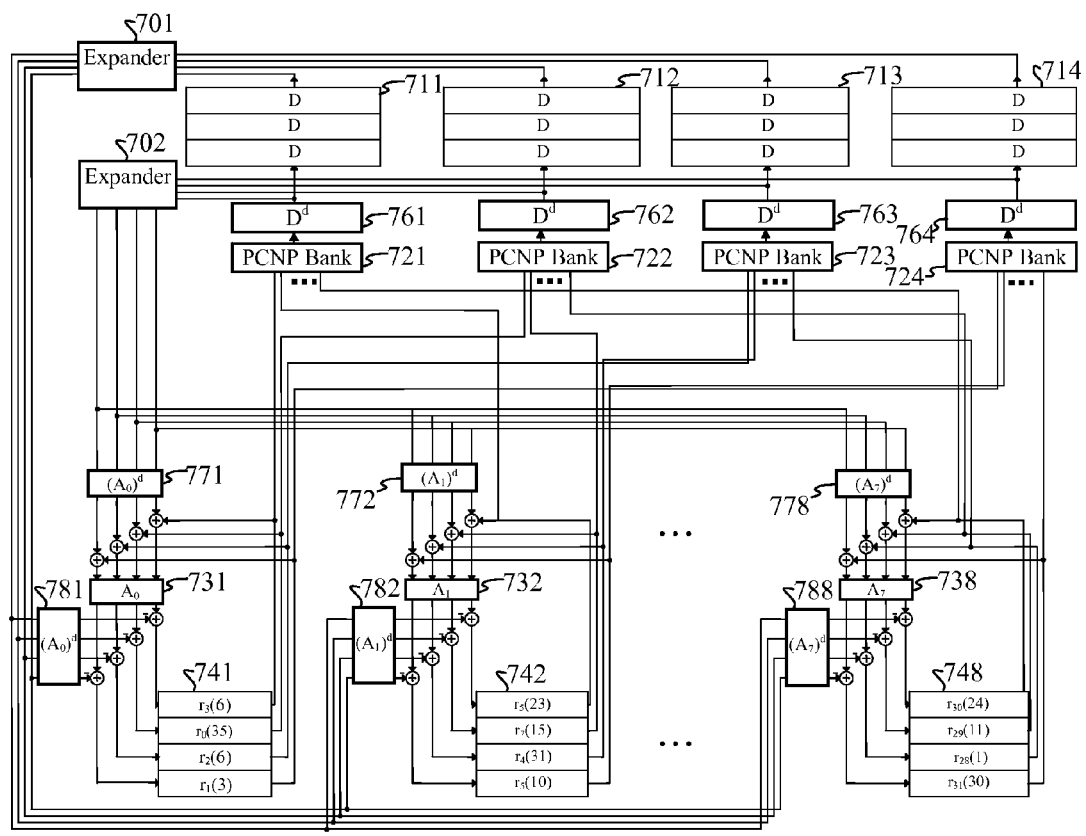
FIG. 14 is a block diagram of a decoder employing a pipelined configuration for high-speed processing.

FIG. 14 is a block diagram of a decoder employing a pipelined configuration for high-speed processing. A set of delay elements 761-764 provide a pipeline delay $D^d$ to the outputs of each PCNP 721-724, wherein the pipeline delay d is an integer that may have any value. Permuters 771 and 781 employ a permutation matrix $(A_0)^d$, permuters 772 and 782 employ a permutation matrix $(A_1)^d$, and permuters 778 and 788 employ a permutation matrix $(A_7)^d$.

The decoder shown in FIG. 14 also supports multi-rate coding (e.g., Rate 1/2, Rate 3/4, and Rate 7/8, . . . ). For example, sub-matrix $H_{34}{}^k$ (or exponent matrix $E_{34}{}^k$) for rate 3/4 can be constructed from sub-matrix $H_{12}{}^k$ by combining each pair of block rows from $H_{12}{}^k$ into one block row. This means that two rows in $H_{12}{}^k$ that check two different sets of bits are now combined into a single row in $H_{34}{}^k$ that checks one set that combines all the bits in the original two sets. Thus, embodiments of the invention may include a common decoding architecture for multi-rate processing that reduces decoder size and complexity.

Figure 15:
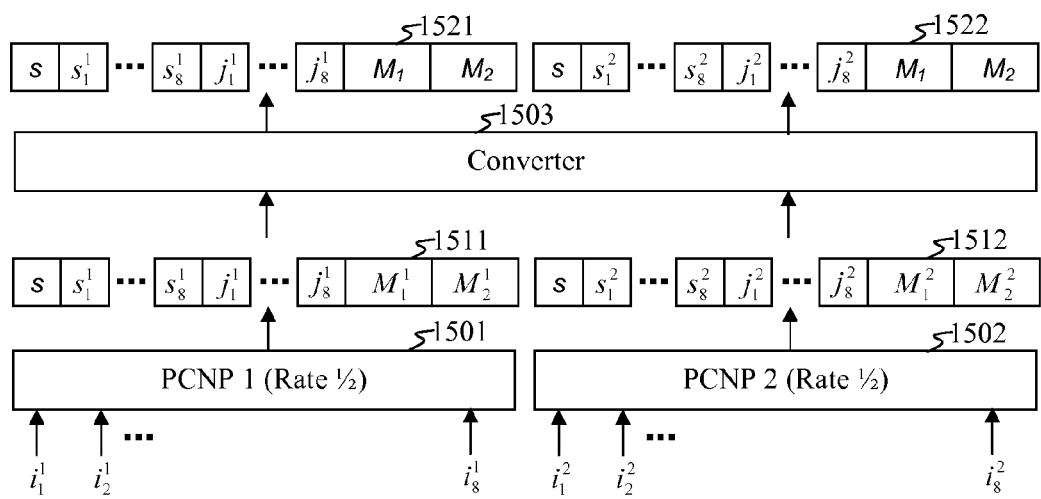
FIG. 15 is a flow diagram of an LDPC decoding method in accordance with an embodiment of the invention.

FIG. 15 is a flow diagram of an LDPC decoding method in accordance with an embodiment of the invention. A first rate-1/2 PCNP 1501 of a PCNP bank is configured for processing a first set of inputs $i_1^1, i_2^1, \ldots, i_8^1$, and a second rate-1/2 PCNP 1502 of a PCNP bank is configured for processing a second set of inputs $i_1^2, i_2^2, \ldots, i_8^2$. The first PCNP 1501 corresponds to the first row of the rate-1/2 parity-check matrix $H_{12}^k$ and the second PCNP 1502 corresponds to the second row of parity-check matrix $H_{12}^k$. The PCNPs 1501 and 1502 produce output data frames 1511 and 1512, respectively. A converter 1503 is configured to modify the outputs 1511 and 1512 such that the same rate-1/2 LDPC decoder may be used to process rate-3/4 inputs. Specifically, the outputs 1511 and 1512 are modified by the converter 1503 as follows $$s = s^1 + s^2,$$

$$M_1 = \min(M_1^1, M_1^2), \text{ and}$$

$$M_2 = \min(M_2^1, M_2^2, \max(M_1^1, M_1^2)).$$

Figure 16:
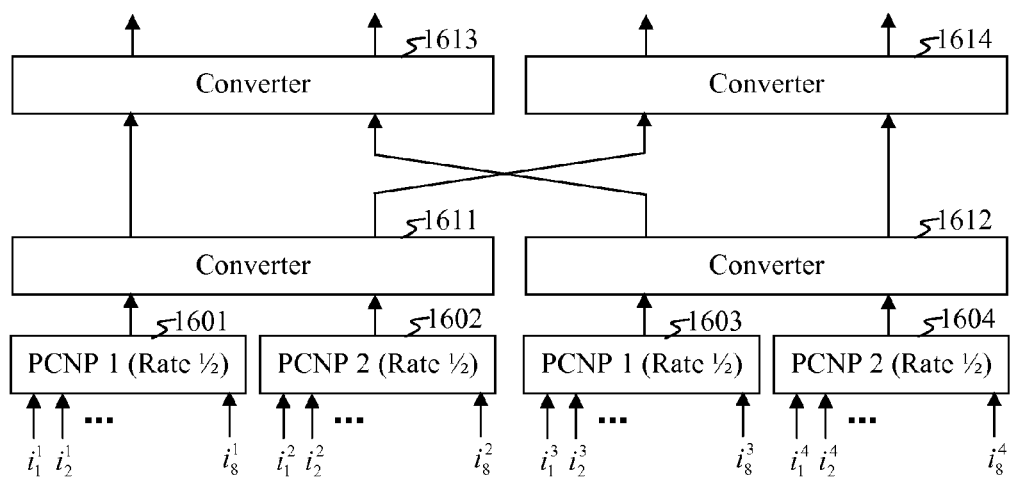
FIG. 16 is a flow diagram of an LDPC decoding method in accordance with another embodiment of the invention.

FIG. 16 is a flow diagram of an LDPC decoding method in accordance with another embodiment of the invention. A first rate-1/2 PCNP 1601 of a PCNP bank is configured for processing a first set of inputs $i_1^1, i_2^1, \ldots, i_8^1$, a second rate-1/2 PCNP 1602 of a PCNP bank is configured for processing a second set of inputs $i_1^2, i_2^2, \ldots, i_8^2$, a third rate-1/2 PCNP 1603 of a PCNP bank is configured for processing a third set of inputs $i_1^3, i_2^3, \ldots, i_8^3$, and a fourth rate-1/2 PCNP 1604 of a PCNP bank is configured for processing a fourth set of inputs $i_1^4, i_2^4, \ldots, i_8^4$ A first converter 1611 processes an output from the first PCNP 1601 having a frame format $s^1, s_1^1, \ldots, j_1^1, \ldots, j_8^1, M_1^1, M_2^1$ and an output from the second PCNP 1602 having a frame format $s^2, s_1^2, \ldots, s_8^2, j_1^2, \ldots, j_8^2, M_1^2, M_2^2$ to produce a first output $s^{12}, s_1^1, \ldots, s_8^1, j_1^1, \ldots, j_8^1, M_1^{12}, M_2^{12}$ and a second outputs $s^{12}, s_1^2, \ldots, s_8^2, j_1^2, \ldots, j_8^2, M_1^{12}, M_2^{12}$ corresponding to rate-3/4. A second converter 1612 processes an output from the third PCNP 1603 having a frame format $s^3, s_1^3, \ldots, s_8^3, j_1^3, \ldots, j_8^3, M_1^3, M_2^3$ and an output from the fourth PCNP 1604 having a frame format $s^4, s_1^4, \ldots, s_8^4, j_1^4, \ldots, j_8^4, M_1^4, M_2^4$ to produce a third output $s^{34}, s_1^3, \ldots, s_8^3, j_1^3, \ldots, j_8^3, M_1^{34}, M_2^{34}$ and a fourth output $s^{34}, s_1^4, \ldots, s_8^4, j_1^4, \ldots, j_8^4, M_1^{34}, M_2^{34}$ corresponding to rate-3/4.

A third converter 1613 processes the first and third rate-3/4 outputs to produce outputs $s, s_1^1, \ldots s_8^1, \ldots j_1^1, \ldots, j_8^1, M_1, M_2$ and $s, s_1^3, \ldots, s_8^3, j_1^3, \ldots, j_8^3, M_1, M_2$ corresponding to rate-7/8. A fourth converter 1614 processes the second and fourth rate-3/4 outputs to produce outputs $s, s_1^2, \ldots, s_8^2, j_1^2, \ldots, j_8^2, M_1, M_2$ and $s, s_1^4, \ldots, s_8^4, j_1^4, \ldots, j_8^4, M_1, M_2$.

It should be appreciated that the apparatus and method embodiments of the invention may be implemented using a variety of hardware and software. For example, one or more of the functional steps described herein may be implemented using special-purpose hardware, such as an application specific integrated circuit (ASIC) and programmable logic devices such as gate arrays, and/or software or firmware running on a computing device, such as a microprocessor, microcontroller or digital signal processor (DSP). It also will be appreciated that although LDPC decoding functions may be integrated in a single device, such as a single ASIC, they may also be distributed among several devices.

The invention is not intended to be limited to the preferred embodiments. Furthermore, those skilled in the art should recognize that the method and apparatus embodiments described herein may be implemented in a variety of ways, including implementations in hardware, software, firmware, or various combinations thereof. Examples of such hardware may include ASICs, Field Programmable Gate Arrays, general-purpose processors, DSPs, and/or other circuitry. Software and/or firmware implementations of the invention may be implemented via any combination of programming languages, including Java, C, C++, Matlab™, Verilog, VHDL, and/or processor specific machine and assembly languages.

Computer programs (i.e., software and/or firmware) implementing the method of this invention may reside on a distribution medium, such as a SIM card, a USB memory interface, or other computer-readable memory. Similarly, computer programs may be distributed to users via wired or wireless network interfaces. From there, they will often be copied to a hard disk or a similar intermediate storage medium. When the programs are to be run, they may be loaded either from their distribution medium or their intermediate storage medium into the execution memory of an onboard digital computer system (e.g. a microprocessor) to act in accordance with the method of this invention. All these operations are well known to those skilled in the art of computer systems.

The term "computer-readable medium" encompasses distribution media, intermediate storage media, execution memory of a computer, and any other medium or device capable of storing for later reading by a digital computer system a computer program implementing the method of this invention.

Various digital computer system configurations can be employed to perform the method embodiments of this invention, and to the extent that a particular system configuration is capable of performing the method embodiments of this invention, it is equivalent to the representative system embodiments of the invention disclosed herein, and within the scope and spirit of this invention.

Once digital computer systems are programmed to perform particular functions pursuant to instructions from program software that implements the method embodiments of the invention, such digital computer systems in effect become special-purpose computers particular to the method embodiments of this invention. The techniques necessary for this programming are well known to those skilled in the art of computer systems.

Various embodiments of the invention may include variations in system configurations and the order of steps in which methods are provided. In many cases, multiple steps and/or multiple components may be consolidated.

The method and system embodiments described herein merely illustrate particular embodiments of the invention. It should be appreciated that those skilled in the art will be able to devise various arrangements, which, although not explicitly described or shown herein, embody the principles of the invention and are included within its spirit and scope. Furthermore, all examples and conditional language recited herein are intended to be only for pedagogical purposes to aid the reader in understanding the principles of the invention. This disclosure and its associated references are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It should be appreciated by those skilled in the art that the block diagrams herein represent conceptual views of illustrative circuitry, algorithms, and functional steps embodying principles of the invention. Similarly, it should be appreciated that any flow charts, flow diagrams, signal diagrams, system diagrams, codes, and the like represent various processes that may be substantially represented in computer-readable medium and so executed by a computer or processor, whether or not such computer or processor is explicitly shown.

The functions of the various elements shown in the drawings, including functional blocks labeled as "processors" or "systems," may be provided through the use of dedicated hardware as well as hardware capable of executing software in association with appropriate software. When provided by a processor, the functions may be provided by a single dedicated processor, by a shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, read-only memory (ROM) for storing software, random access memory (RAM), and non-volatile storage. Other hardware, conventional and/or custom, may also be included. Similarly, the function of any component or device described herein may be carried out through the operation of program logic, through dedicated logic, through the interaction of program control and dedicated logic, or even manually, the particular technique being selectable by the implementer as more specifically understood from the context.

Any element expressed herein as a means for performing a specified function is intended to encompass any way of performing that function including, for example, a combination of circuit elements which performs that function, or software in any form, including, therefore, firmware, micro-code or the like, combined with appropriate circuitry for executing that software to perform the function. Embodiments of the invention as described herein reside in the fact that the functionalities provided by the various recited means are combined and brought together in the manner which the operational descriptions call for. Applicant regards any means that can provide those functionalities as equivalent to those shown herein.

The invention claimed is:

1. A method for wireless communications, comprising:
   obtaining a low density parity check (LDPC) matrix of size R×C square blocks, wherein the LDPC matrix is partitioned into a plurality of super codes each comprising one or more block-rows of the LDPC matrix, and wherein at least one super code of the plurality of super codes comprises at least C−R block-columns having a variable-node degree of not greater than one;
   encoding data to generate a packet of encoded data, wherein the data are encoded at one or more rates based on the obtained LDPC matrix; and
   transmitting the packet.

2. The method of claim 1, wherein each square block in the LDPC matrix comprises a zero square matrix or a cyclic shift of an identity matrix.

3. The method of claim 1, wherein non-zero square blocks of the at least C−R block-columns of a super code of the plurality of super codes are reused in the same number of block-columns in another super code of the plurality of super codes.

4. The method of claim 1, wherein at least one super code of the plurality of super codes comprises square sub-matrices of size 4×4 square blocks.

5. The method of claim 1, wherein:
   a portion of each super code of the plurality of super codes is partitioned into square sub-matrices, and
   square sub-matrices of a first super code of the plurality of super codes are used to obtain square sub-matrices of other super codes of the plurality of super codes using permutation patterns.

6. The method of claim 5, wherein each of the square sub-matrices comprises rows and columns of blocks, and further wherein each of the square sub-matrices comprises only one non-zero block per row and only one non-zero block per column.

7. The method of claim 1, wherein the LDPC matrix is rate half.

8. The method of claim 1, wherein the data are encoded at least one rate using at least one LDPC matrix generated from the obtained LDPC matrix by combining at least two block rows of the obtained LDPC matrix.

9. The method of claim 8, wherein:
   the at least one rate is defined as A/B,
   A and B are positive integers and
   A is less than B.

10. The method of claim 1, wherein the LDPC matrix comprises a first portion and a second portion, and wherein the second portion is invertible and has a block-triangular structure.

11. The method of claim 10, wherein encoding the data to generate the packet comprises:
    obtaining an intermediate data using the data and the first portion of the LDPC matrix; and
    encoding the data using the obtained intermediate data and the second portion of the LDPC matrix.

12. An apparatus for wireless communications, comprising:
    a circuit configured to obtain a low density parity check (LDPC) matrix of size R×C square blocks, wherein the LDPC matrix is partitioned into a plurality of super codes each comprising one or more block-rows of the LDPC matrix, and wherein at least one super code of the plurality of super codes comprises at least C−R block-columns having a variable-node degree of not greater than one;
    an encoder configured to encode data to generate a packet of encoded data, wherein the data are encoded at one or more rates based on the obtained LDPC matrix; and
    a transmitter configured to transmit the packet.

13. The apparatus of claim 12, wherein each square block in the LDPC matrix comprises a zero square matrix or a cyclic shift of an identity matrix.

14. The apparatus of claim 12, wherein non-zero square blocks of the at least C−R block-columns of a super code of the plurality of super codes are reused in the same number of block-columns in another super code of the plurality of super codes.

15. The apparatus of claim 12, wherein at least one super code of the plurality of super codes comprises square sub-matrices of size 4×4 square blocks.

16. The apparatus of claim 12, wherein:
    a portion of each super code of the plurality of super codes is partitioned into square sub-matrices, and
    square sub-matrices of a first super code of the plurality of super codes are used to obtain square sub-matrices of other super codes of the plurality of super codes using permutation patterns.

17. The apparatus of claim 16, wherein each of the square sub-matrices comprises rows and columns of blocks, and further wherein each of the square sub-matrices comprises only one non-zero block per row and only one non-zero block per column.

18. The apparatus of claim 12, wherein the LDPC matrix is rate half.

19. The apparatus of claim 12, wherein the data are encoded at least one rate using at least one LDPC matrix generated from the obtained LDPC matrix by combining at least two block rows of the obtained LDPC matrix.

20. The apparatus of claim 19, wherein:
the at least one rate is defined as A/B,
A and B are positive integers and
A is less than B.

21. The apparatus of claim 12, wherein the LDPC matrix comprises a first portion and a second portion, and wherein the second portion is invertible and has a block-triangular structure.

22. The apparatus of claim 21, wherein the encoder configured to encode the data to generate the packet comprises:
a circuit configured to obtain an intermediate data using the data and the first portion of the LDPC matrix; and
an encoding circuit configured to encode the data using the obtained intermediate data and the second portion of the LDPC matrix.

23. An apparatus for wireless communications, comprising:
means for obtaining a low density parity check (LDPC) matrix of size R×C square blocks, wherein the LDPC matrix is partitioned into a plurality of super codes each comprising one or more block-rows of the LDPC matrix, and wherein at least one super code of the plurality of super codes comprises at least C−R block-columns having a variable-node degree of not greater than one;
means for encoding data to generate a packet of encoded data, wherein the data are encoded at one or more rates based on the obtained LDPC matrix; and
means for transmitting the packet.

24. A computer-program product for wireless communications, comprising a computer-readable medium comprising instructions executable to:
obtain a low density parity check (LDPC) matrix of size R×C square blocks, wherein the LDPC matrix is partitioned into a plurality of super codes each comprising one or more block-rows of the LDPC matrix, and wherein at least one super code of the plurality of super codes comprises at least C−R block-columns having a variable-node degree of not greater than one;
encode data to generate a packet of encoded data, wherein the data are encoded at one or more rates based on the obtained LDPC matrix; and
transmit the packet.

25. A wireless node, comprising:
at least one antenna;
a circuit configured to obtain a low density parity check (LDPC) matrix of size R×C square blocks, wherein the LDPC matrix is partitioned into a plurality of super codes each comprising one or more block-rows of the LDPC matrix, and wherein at least one super code of the plurality of super codes comprises at least C−R block-columns having a variable-node degree of not greater than one;
an encoder configured to encode data to generate a packet of encoded data, wherein the data are encoded at one or more rates based on the obtained LDPC matrix; and
a transmitter configured to transmit the packet via the at least one antenna.

26. A method for wireless communications, comprising:
receiving a packet of encoded data, wherein the packet was generated by encoding data at one or more rates based on a low density parity check (LDPC) matrix, wherein the LDPC matrix is of size R×C square blocks, and wherein the LDPC matrix is partitioned into a plurality of super codes each comprising one or more block-rows of the LDPC matrix, and wherein at least one super code of the plurality of super codes comprises at least C−R block-columns having a variable-node degree of not greater than one; and
iteratively decoding a plurality of super codes of the LDPC matrix by sharing a single constituent resource, wherein results of the iterative decoding are used for decoding one or more other super codes of the plurality of super codes.

27. The method of claim 26, wherein the single constituent resource comprises:
parity check node processors configured to process variable node reliability messages of the LDPC matrix, and
wherein a number of the parity check node processors is equal to a number of rows in a super code of the plurality of super codes having a largest number of rows.

28. The method of claim 26, wherein iteratively decoding comprises permuting reliability messages of the LDPC matrix using fixed connections.

29. The method of claim 26, wherein iteratively decoding comprises:
decoding in a pipelined fashion as decoding results become available.

30. The method of claim 29, wherein decoding in the pipelined fashion comprises permuting reliability messages of the LDPC matrix using fixed connections.

31. The method of claim 26, further comprising:
storing variable node reliability messages in banks of block-shift registers of the single constituent resource, wherein each of the banks comprises a number of block-shift registers corresponding to a number of block-rows of a super code of the plurality of super codes having a largest number of block-rows.

32. The method of claim 26, wherein iteratively decoding comprises:
updating check node reliability messages; and
storing the updated check node reliability messages in block shift registers of the single constituent resource.

33. The method of claim 26, wherein iteratively decoding comprises:
using the single constituent resource to decode the packet at one or more rates based on the LDPC matrix.

34. The method of claim 33, wherein the single constituent resource comprises:
banks of parity check node processors configured to process variable node reliability messages of the LDPC matrix, and
wherein outputs of the banks of the parity check node processors used to decode at a first rate are combined to decode at a second rate.

35. The method of claim 34, wherein the first rate is rate 1/2, the second rate is rate 3/4, and the outputs of two banks of the parity check node processors are combined.

36. The method of claim 34, wherein the first rate is rate 1/2, the second rate is rate 7/8, and the outputs of four banks of the parity check node processors are combined.

37. The method of claim 35, wherein the single constituent resource comprises parity check node processors used to process variable node reliability messages of the LDPC matrix, and wherein the method further comprising:

storing outputs of each of the parity check node processors in a compressed form.

38. The method of claim 37, wherein storing the outputs of each of the parity check node processors in the compressed form comprises:

allocating one bit for a product sign obtained using signs of all input messages;

allocating one bit for each sign of each input message;

allocating one indicator bit for each output indicating whether or not an absolute value of the input message is the smallest of all the input messages;

allocating a plurality of bits for a smallest absolute value of all the input messages; and allocating a plurality of bits for a second smallest absolute value of all the input messages.

39. The method of claim 38, wherein the smallest absolute value of all the input messages is computed in parallel.

40. The method of claim 38, wherein the second smallest absolute value of all the input messages is computed in parallel.

41. An apparatus for wireless communications, comprising:

a receiver configured to receive a packet of encoded data, wherein the packet was generated by encoding data at one or more rates based on a low density parity check (LDPC) matrix, wherein the LDPC matrix is of size R×C square blocks, and wherein the LDPC matrix is partitioned into a plurality of super codes each comprising one or more block-rows of the LDPC matrix, and wherein at least one super code of the plurality of super codes comprises at least C−R block-columns having a variable-node degree of not greater than one; and a decoder configured to iteratively decode a plurality of super codes of the LDPC matrix by sharing a single constituent resource, wherein results of the iterative decoding are used for decoding one or more other super codes of the plurality of super codes.

42. The apparatus of claim 41, wherein the single constituent resource comprises:

parity check node processors configured to process variable node reliability messages of the LDPC matrix, and wherein a number of the parity check node processors is equal to a number of rows in a super code of the plurality of super codes having a largest number of rows.

43. The apparatus of claim 41, wherein the decoder configured to iteratively decode comprises a permuter configured to permute reliability messages of the LDPC matrix using fixed connections.

44. The apparatus of claim 41, wherein the decoder configured to iteratively decode comprises:

a decoding circuit configured to decode in a pipelined fashion as decoding results become available.

45. The apparatus of claim 44, wherein the decoding circuit configured to decode in the pipelined fashion comprises a permuter configured to permute reliability messages of the LDPC matrix using fixed connections.

46. The apparatus of claim 41, further comprising:

a storing circuit configured to store variable node reliability messages in banks of block-shift registers of the single constituent resource, wherein each of the banks comprises a number of block-shift registers corresponding to a number of block-rows of a super code of the plurality of super codes having a largest number of block-rows.

47. The apparatus of claim 41, wherein the decoder configured to iteratively decode comprises:

an updating circuit configured to update check node reliability messages; and a storing circuit configured to store the updated check node reliability messages in block shift registers of the single constituent resource.

48. The apparatus of claim 41, wherein the decoder configured to iteratively decode comprises:

a circuit configured to use the single constituent resource to decode the packet at one or more rates based on the LDPC matrix.

49. The apparatus of claim 48, wherein the single constituent resource comprises:

banks of parity check node processors configured to process variable node reliability messages of the LDPC matrix, and wherein outputs of the banks of the parity check node processors used to decode at a first rate are combined to decode at a second rate.

50. The apparatus of claim 49, wherein the first rate is rate 1/2, the second rate is rate 3/4, and the outputs of two banks of the parity check node processors are combined.

51. The apparatus of claim 49, wherein the first rate is rate 1/2, the second rate is rate 7/8, and the outputs of four banks of the parity check node processors are combined.

52. The apparatus of claim 41, wherein the single constituent resource comprises parity check node processors used to process variable node reliability messages of the LDPC matrix, and wherein the apparatus further comprising:

a storing circuit configured to store outputs of each of the parity check node processors in a compressed form.

53. The apparatus of claim 52, wherein the storing circuit configured to store the outputs of each of the parity check node processors in the compressed form comprises:

a first circuit configured to allocate one bit for a product sign obtained using signs of all input messages;

a second circuit configured to allocate one bit for each sign of each input message;

a third circuit configured to allocate one indicator bit for each output indicating whether or not an absolute value of the input message is the smallest of all the input messages;

a fourth circuit configured to allocate a plurality of bits for a smallest absolute value of all the input messages; and a fifth circuit configured to allocate a plurality of bits for a second smallest absolute value of all the input messages.

54. The apparatus of claim 53, wherein the smallest absolute value of all the input messages is computed in parallel.

55. The apparatus of claim 53, wherein the second smallest absolute value of all the input messages is computed in parallel.

56. An apparatus for wireless communications, comprising:

means for receiving a packet of encoded data, wherein the packet was generated by encoding data at one or more rates based on a low density parity check (LDPC) matrix, wherein the LDPC matrix is of size R×C square blocks, and wherein the LDPC matrix is partitioned into a plurality of super codes each comprising one or more block-rows of the LDPC matrix, and wherein at least one super code of the plurality of super codes comprises at least C−R block-columns having a variable-node degree of not greater than one; and means for iteratively decoding a plurality of super codes of the LDPC matrix by sharing a single constituent resource, wherein results of the iterative decoding are used for decoding one or more other super codes of the plurality of super codes.

57. A computer-program product for wireless communications, comprising a computer-readable medium comprising instructions executable to:

receive a packet of encoded data, wherein the packet was generated by encoding data at one or more rates based on a low density parity check (LDPC) matrix, wherein the LDPC matrix is of size R×C square blocks, and wherein the LDPC matrix is partitioned into a plurality of super codes each comprising one or more block-rows of the LDPC matrix, and wherein at least one super code of the plurality of super codes comprises at least C–R block-columns having a variable-node degree of not greater than one; and iteratively decode a plurality of super codes of the LDPC matrix by sharing a single constituent resource, wherein results of the iterative decoding are used for decoding one or more other super codes of the plurality of super codes.

58. A wireless node, comprising:

at least one antenna;

a receiver configured to receive a packet of encoded data via the at least one antenna, wherein the packet was generated by encoding data at one or more rates based on a low density parity check (LDPC) matrix, wherein the LDPC matrix is of size R×C square blocks, and wherein the LDPC matrix is partitioned into a plurality of super codes each comprising one or more block-rows of the LDPC matrix, and wherein at least one super code of the plurality of super codes comprises at least C–R block-columns having a variable-node degree of not greater than one; and a decoder configured to iteratively decode a plurality of super codes of the LDPC matrix by sharing a single constituent resource, wherein results of the iterative decoding are used for decoding one or more other super codes of the plurality of super codes.

* * * * *